US009031412B2

(12) United States Patent
Nagarajan et al.

(10) Patent No.: US 9,031,412 B2
(45) Date of Patent: May 12, 2015

(54) COOLERLESS PHOTONIC INTEGRATED CIRCUITS (PICS) FOR WDM TRANSMISSION NETWORKS AND PICS OPERABLE WITH A FLOATING SIGNAL CHANNEL GRID CHANGING WITH TEMPERATURE BUT WITH FIXED CHANNEL SPACING IN THE FLOATING GRID

(75) Inventors: Radhakrishnan L. Nagarajan, Cupertino, CA (US); Fred A. Kish, Jr., Palo Alto, CA (US); David F. Welch, Menlo Park, CA (US); Drew D. Perkins, Saratoga, CA (US); Masaki Kato, Sunnyvale, CA (US)

(73) Assignee: Infinera Corporation, Sunnyvale, CA (US)

(*) Notice: Subject to any disclaimer, the term of this patent is extended or adjusted under 35 U.S.C. 154(b) by 714 days.

(21) Appl. No.: 12/612,646

(22) Filed: Nov. 4, 2009

(65) Prior Publication Data
US 2010/0166424 A1 Jul. 1, 2010

Related U.S. Application Data

(62) Division of application No. 11/106,875, filed on Apr. 14, 2005, now Pat. No. 7,636,522.

(60) Provisional application No. 60/563,161, filed on Apr. 15, 2004.

(51) Int. Cl.
*H04J 14/02* (2006.01)
*H04B 10/50* (2013.01)
(Continued)

(52) U.S. Cl.
CPC .............. *G02B 6/12033* (2013.01); *B82Y 20/00* (2013.01); *G02B 6/12019* (2013.01);
(Continued)

(58) Field of Classification Search
USPC ................................................... 398/95, 196
See application file for complete search history.

(56) References Cited

U.S. PATENT DOCUMENTS 5,953,359 A * 9/1999 Yamaguchi et al. ........ 372/50.12
6,291,813 B1 * 9/2001 Ackerman et al. ........ 250/214 R
(Continued)

*Primary Examiner* — Shi K Li
(74) *Attorney, Agent, or Firm* — David L. Soltz

(57) ABSTRACT

A coolerless photonic integrated circuit (PIC), such as a semiconductor electro-absorption modulator/laser (EML) or a coolerless optical transmitter photonic integrated circuit (TxPIC), may be operated over a wide temperature range at temperatures higher then room temperature without the need for ambient cooling or hermetic packaging. Since there is large scale integration of N optical transmission signal WDM channels on a TxPIC chip, a new DWDM system approach with novel sensing schemes and adaptive algorithms provides intelligent control of the PIC to optimize its performance and to allow optical transmitter and receiver modules in DWDM systems to operate uncooled. Moreover, the wavelength grid of the on-chip channel laser sources may thermally float within a WDM wavelength band where the individual emission wavelengths of the laser sources are not fixed to wavelength peaks along a standardized wavelength grid but rather may move about with changes in ambient temperature. However, control is maintained such that the channel spectral spacing between channels across multiple signal channels, whether such spacing is periodic or aperiodic, between adjacent laser sources in the thermally floating wavelength grid are maintained in a fixed relationship. Means are then provided at an optical receiver to discover and lock onto floating wavelength grid of transmitted WDM signals and thereafter demultiplex the transmitted WDM signals for OE conversion.

19 Claims, 17 Drawing Sheets

(51) Int. Cl.
  *G02B 6/12* (2006.01)
  *B82Y 20/00* (2011.01)
  *H01S 5/024* (2006.01)
  *H01S 5/223* (2006.01)
  *H01S 5/40* (2006.01)
  *G02B 6/28* (2006.01)
  *G02B 6/293* (2006.01)
  *H01S 5/00* (2006.01)
  *H01S 5/022* (2006.01)
  *H01S 5/026* (2006.01)
  *H01S 5/0683* (2006.01)
  *H01S 5/10* (2006.01)
  *H01S 5/12* (2006.01)
  *H01S 5/343* (2006.01)

(52) U.S. Cl.
  CPC .............. *G02B6/2813* (2013.01); *G02B 6/293* (2013.01); *G02B 6/29317* (2013.01); *G02B 6/29338* (2013.01); *G02B 6/29352* (2013.01); *H01S 5/005* (2013.01); *H01S 5/0085* (2013.01); *H01S 5/02248* (2013.01); *H01S 5/024* (2013.01); *H01S 5/0261* (2013.01); *H01S 5/0265* (2013.01); *H01S 5/0268* (2013.01); *H01S 5/0683* (2013.01); *H01S 5/1032* (2013.01); *H01S 5/12* (2013.01); *H01S 5/1221* (2013.01); *H01S 5/2231* (2013.01); *H01S 5/34306* (2013.01); *H01S 5/4031* (2013.01); *H01S 5/4087* (2013.01); *H04B 10/506* (2013.01)

(56) References Cited

U.S. PATENT DOCUMENTS

| | | | | |
|---|---|---|---|---|
| 6,301,031 | B2* | 10/2001 | Li | 398/9 |
| 6,574,260 | B2* | 6/2003 | Salvatore et al. | 372/50.11 |
| 6,826,212 | B2* | 11/2004 | Shirai et al. | 372/36 |
| 2003/0095737 | A1* | 5/2003 | Welch et al. | 385/14 |
| 2004/0190580 | A1* | 9/2004 | Pezeshki et al. | 372/96 |

* cited by examiner

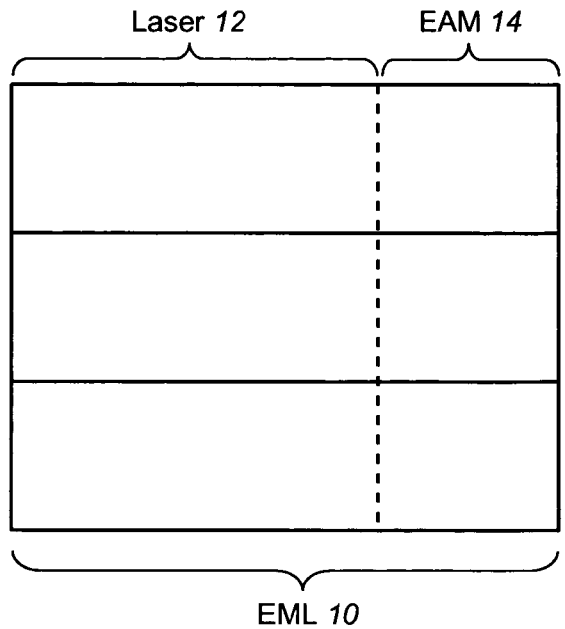
FIG._1
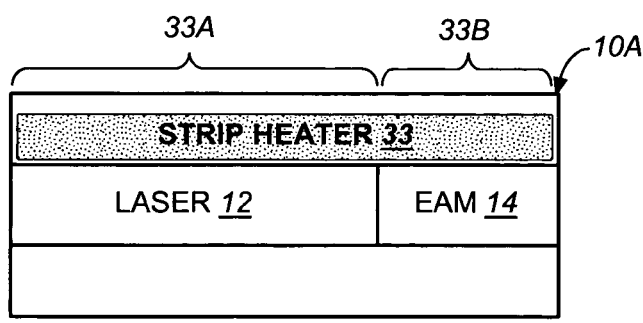
FIG._6
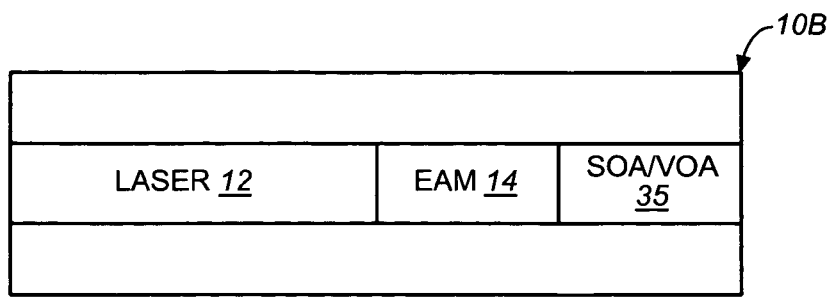
FIG._7

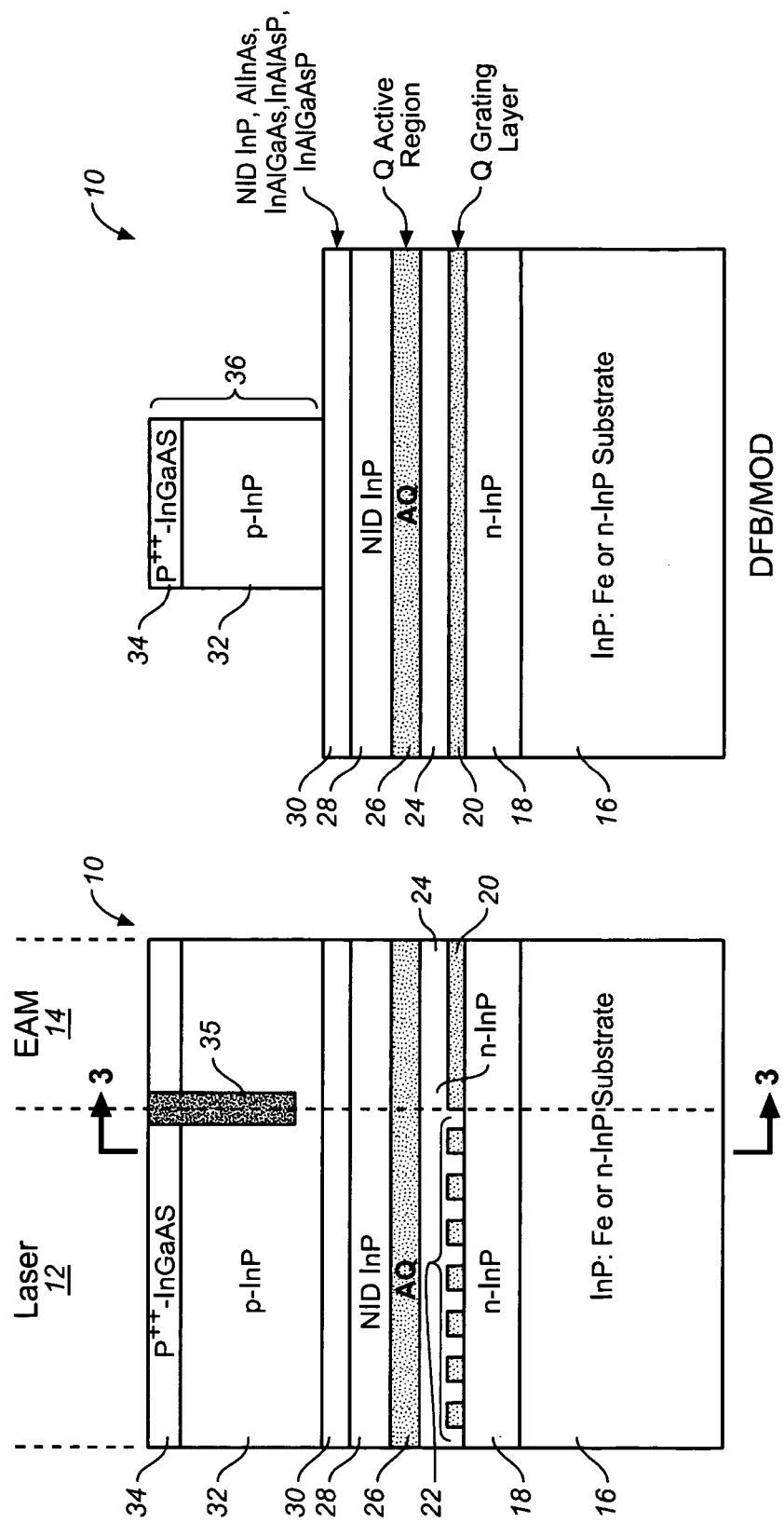
FIG._3
FIG._2

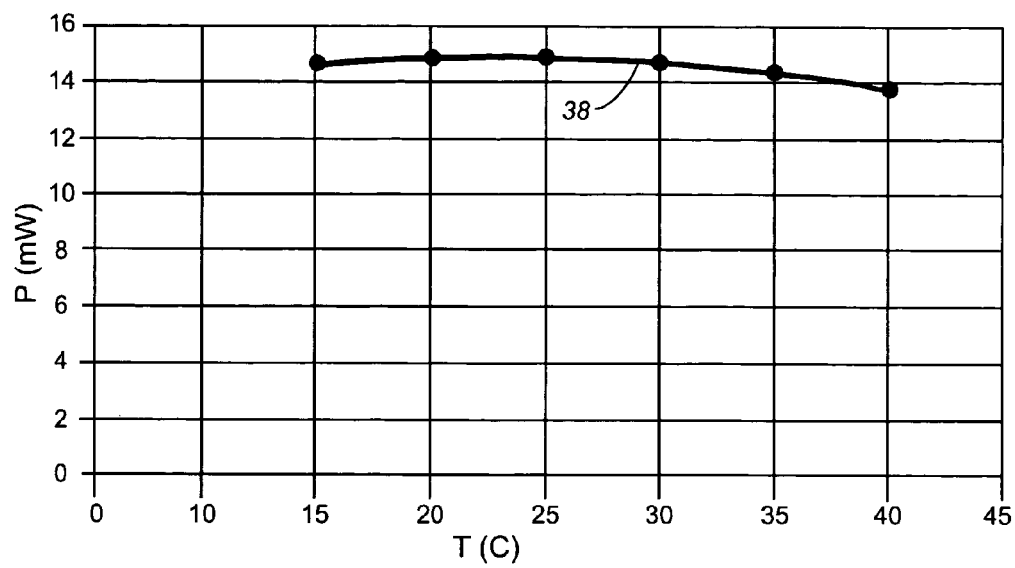
FIG._4
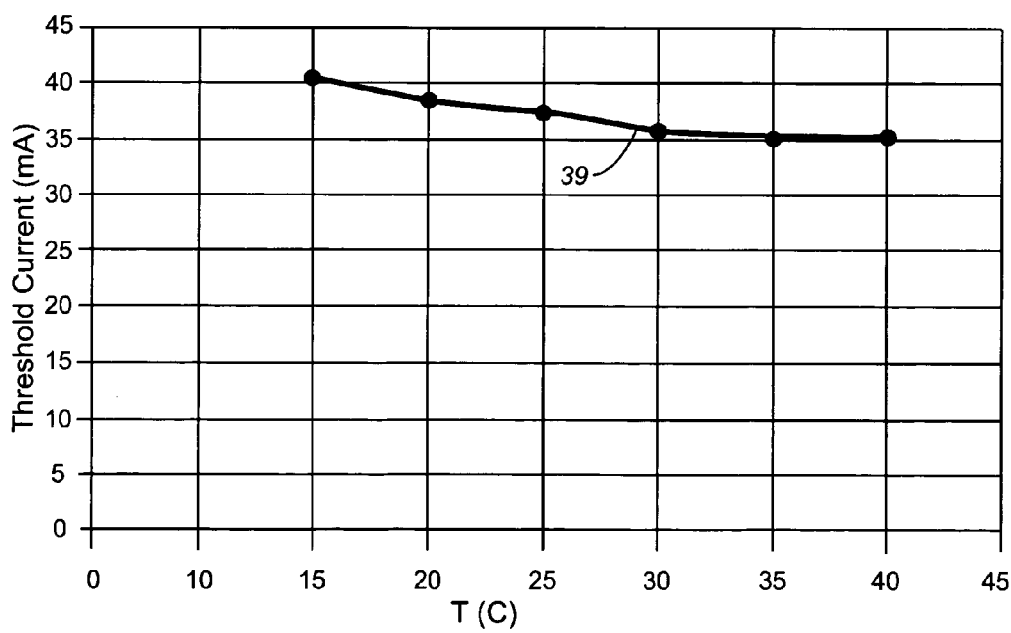
FIG._5

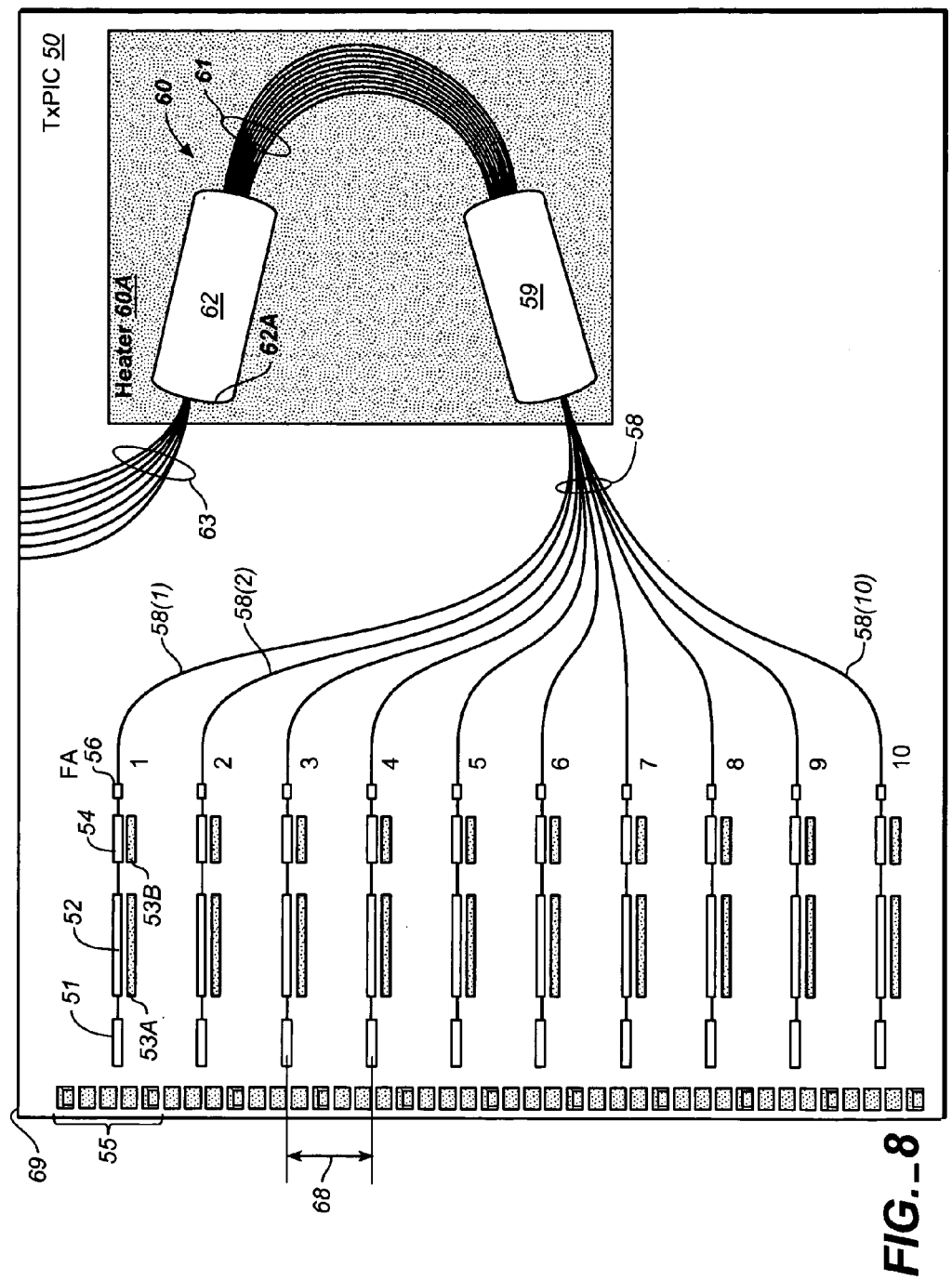
FIG._8

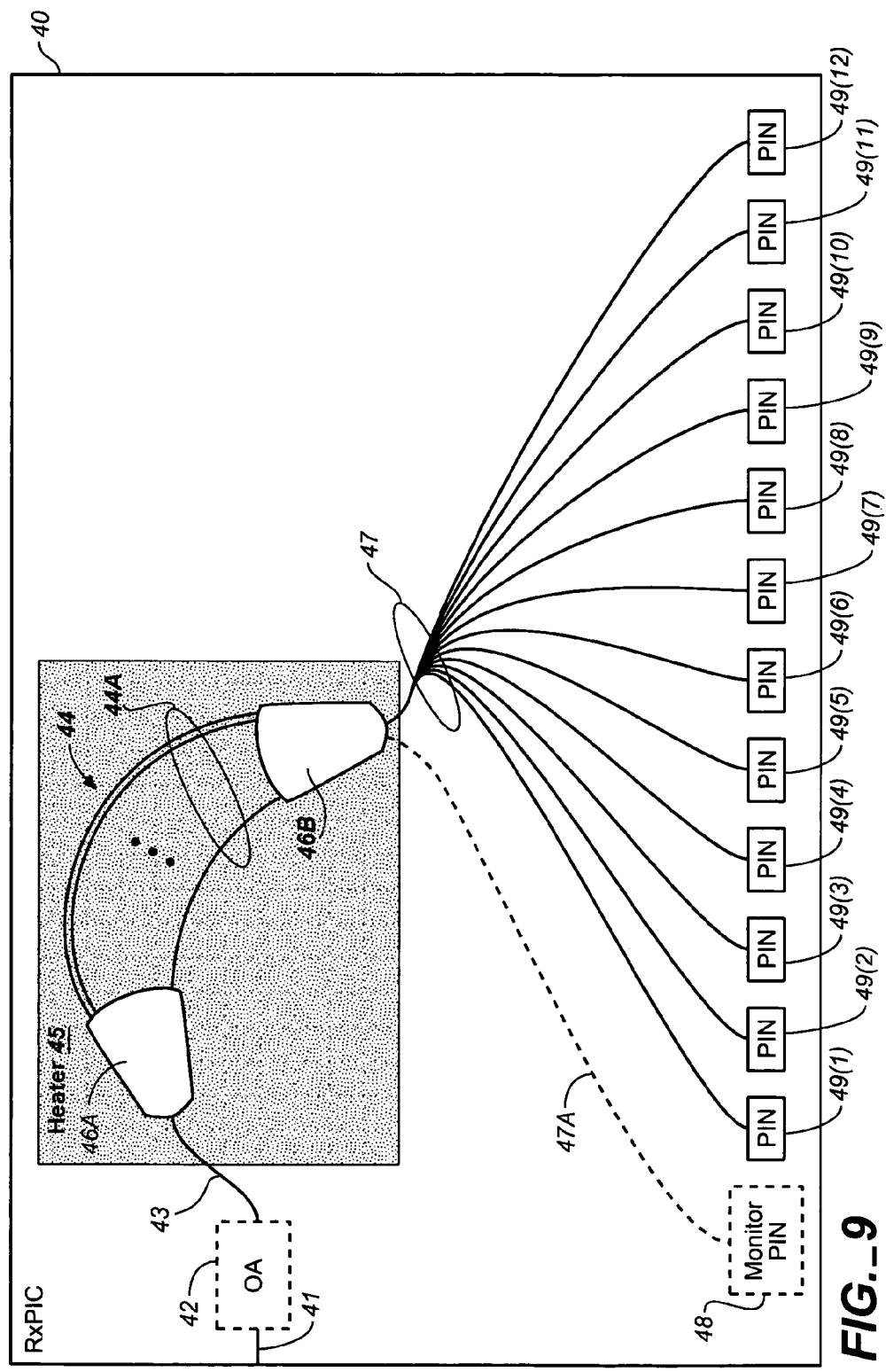
FIG._9

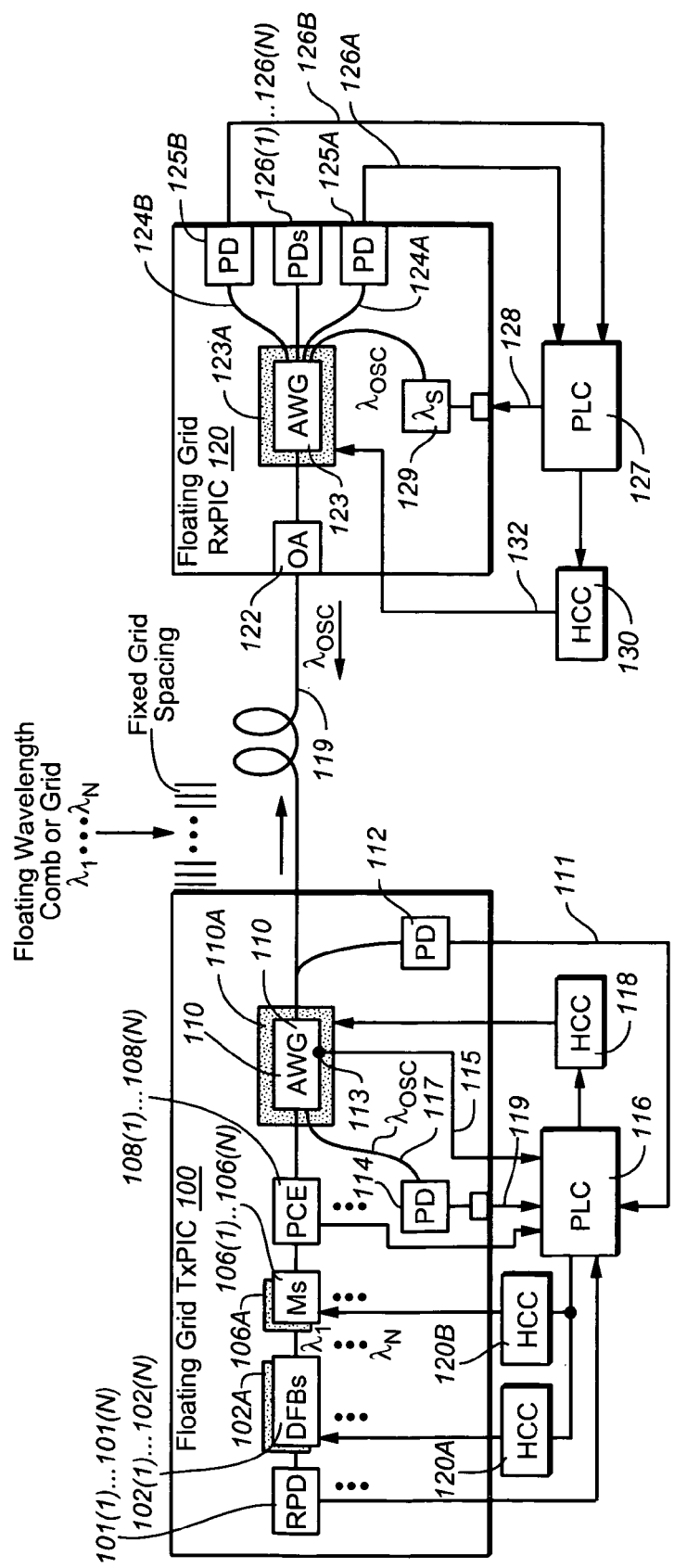
FIG._10

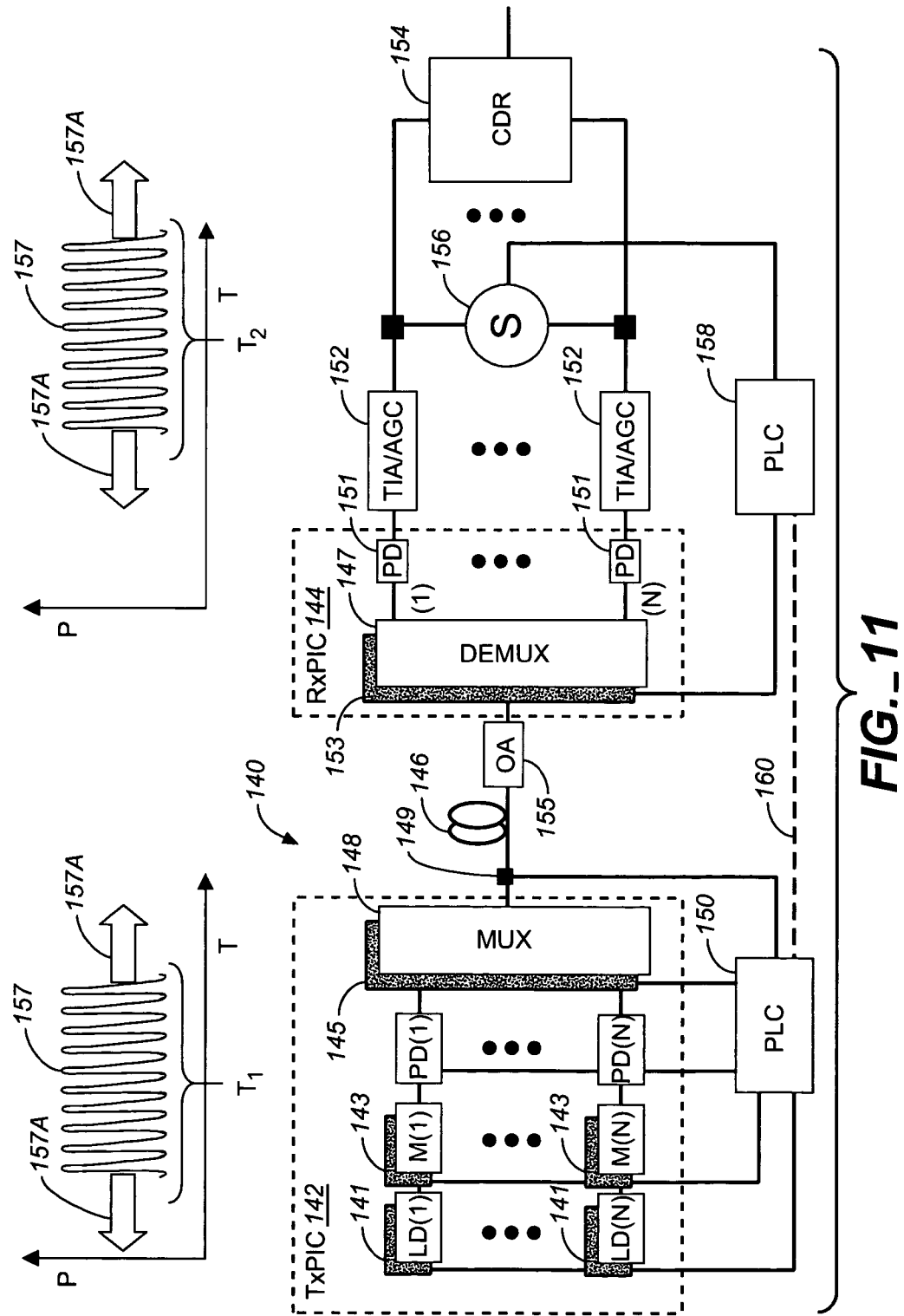
FIG._11

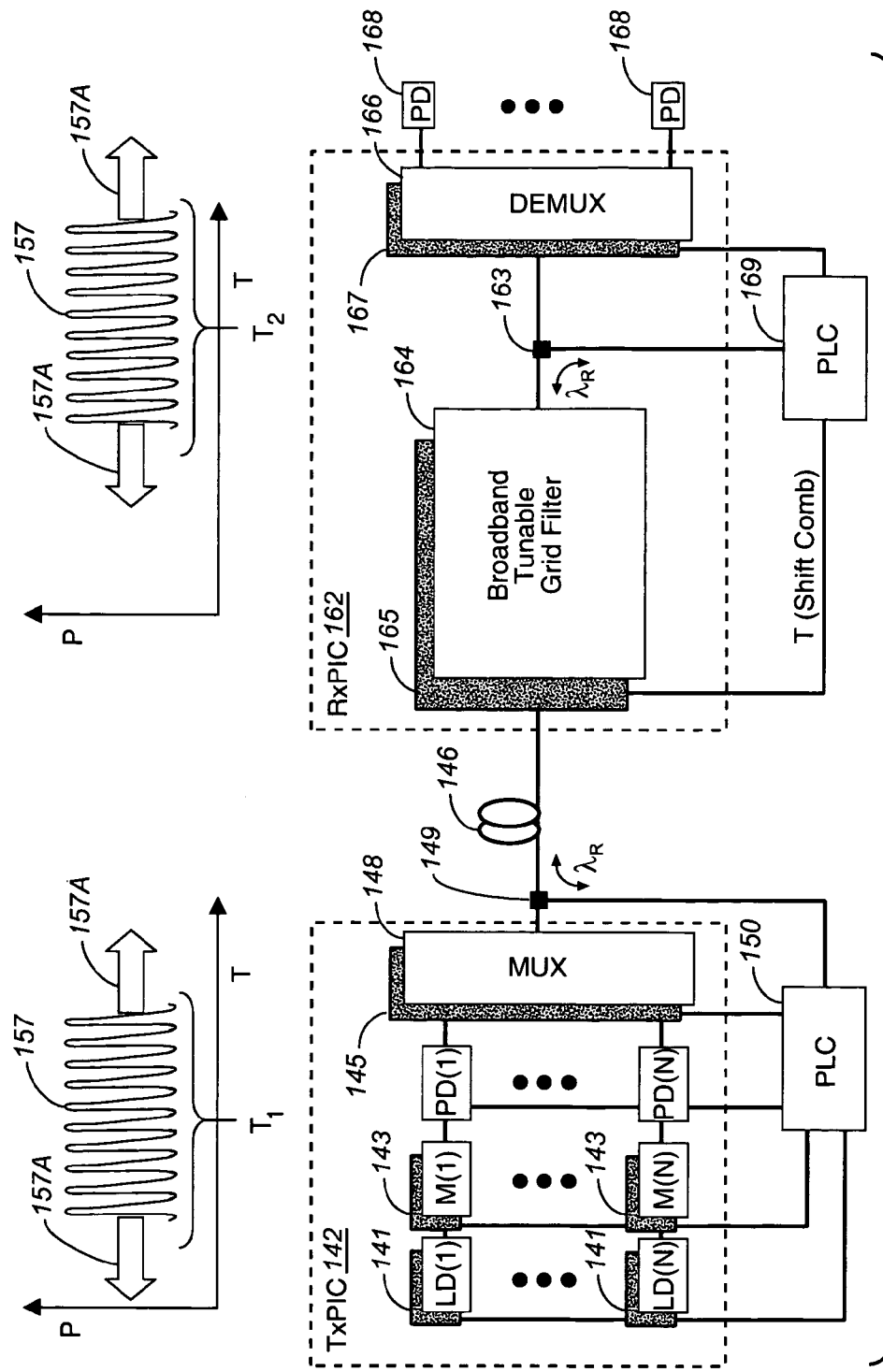
FIG._12

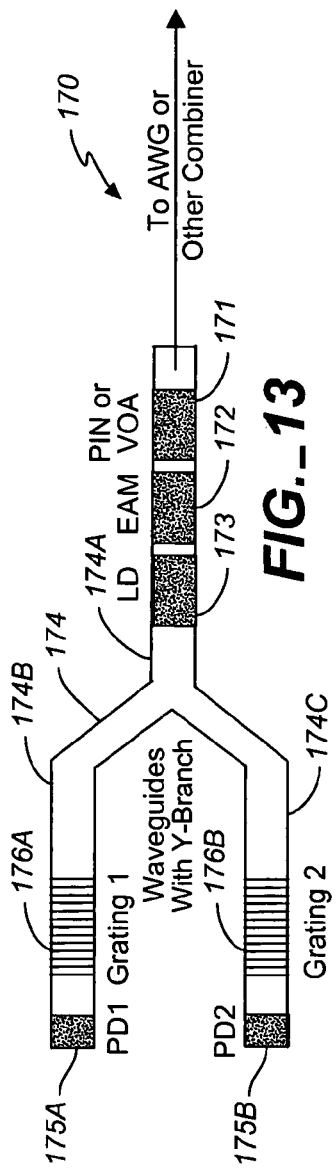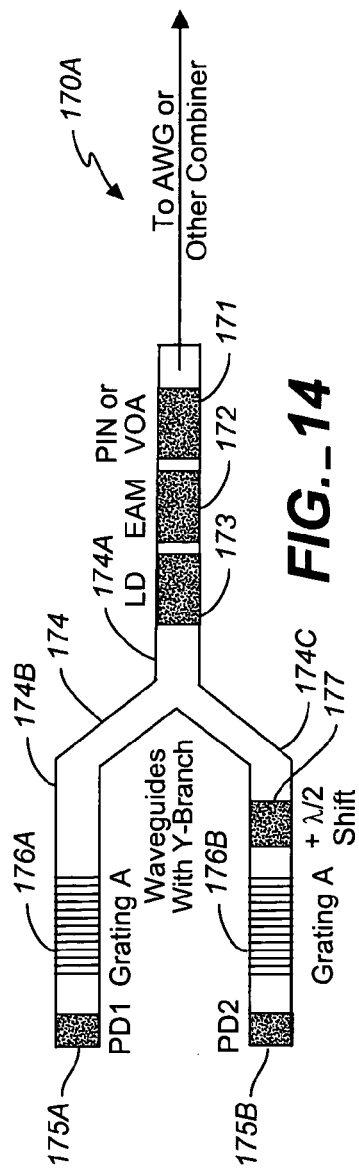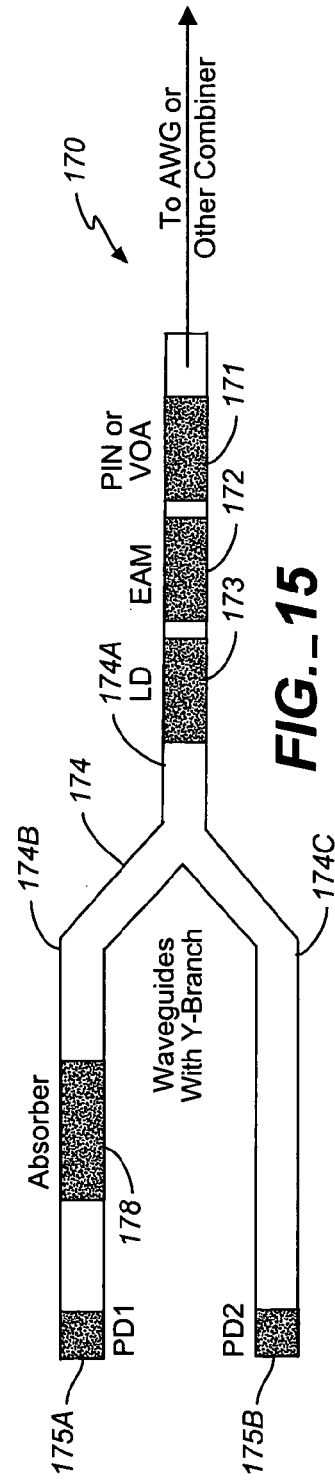

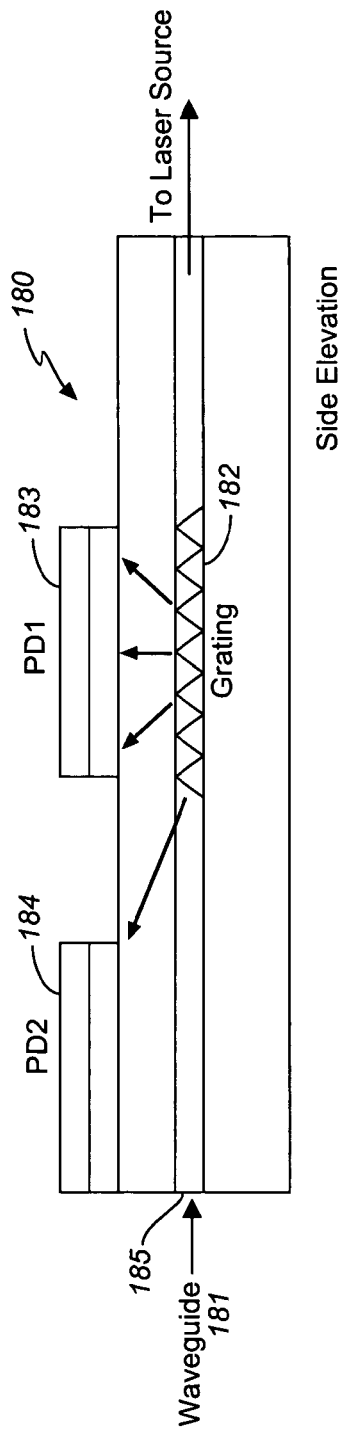
FIG._16
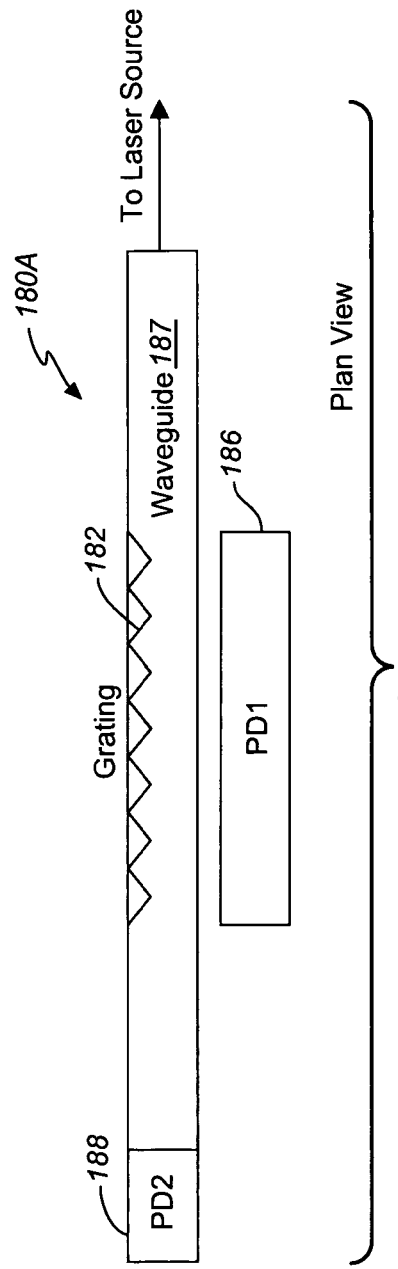
FIG._17

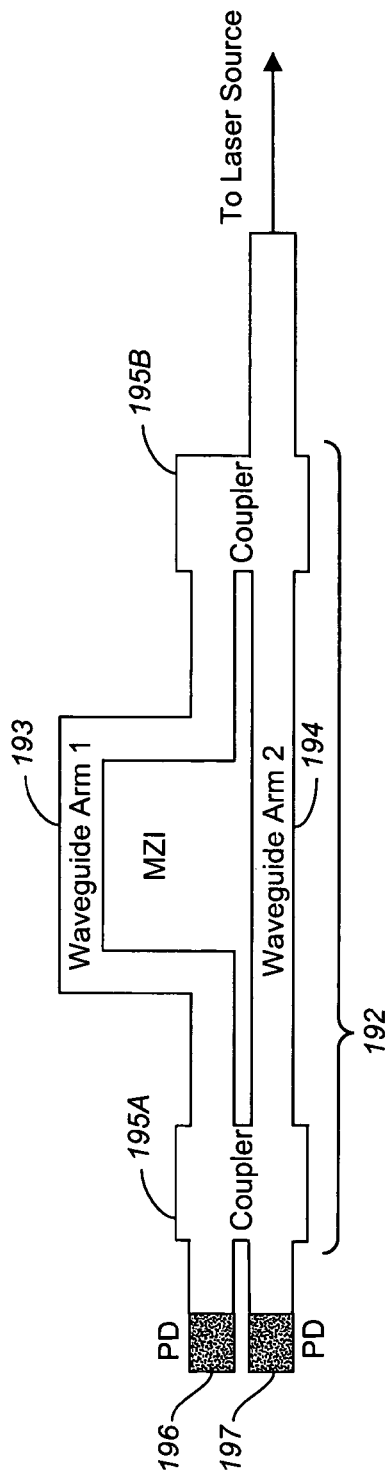
FIG._18
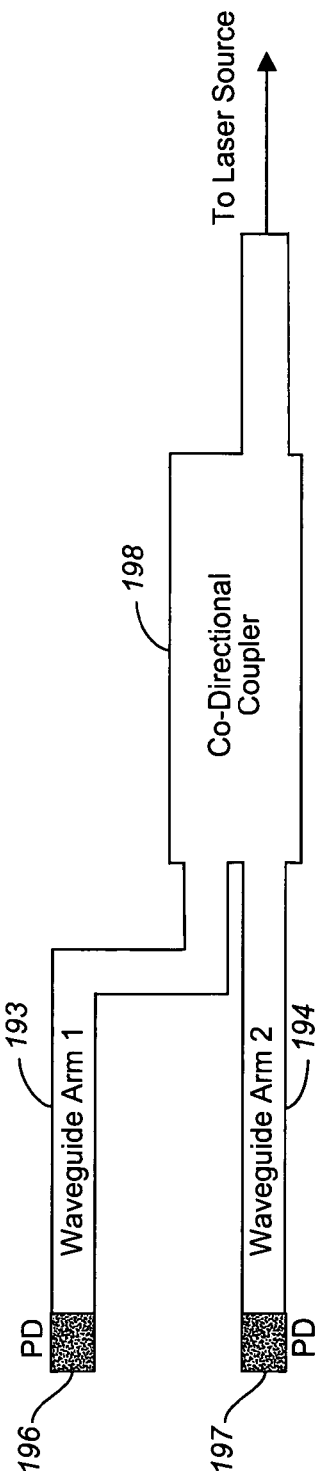
FIG._19

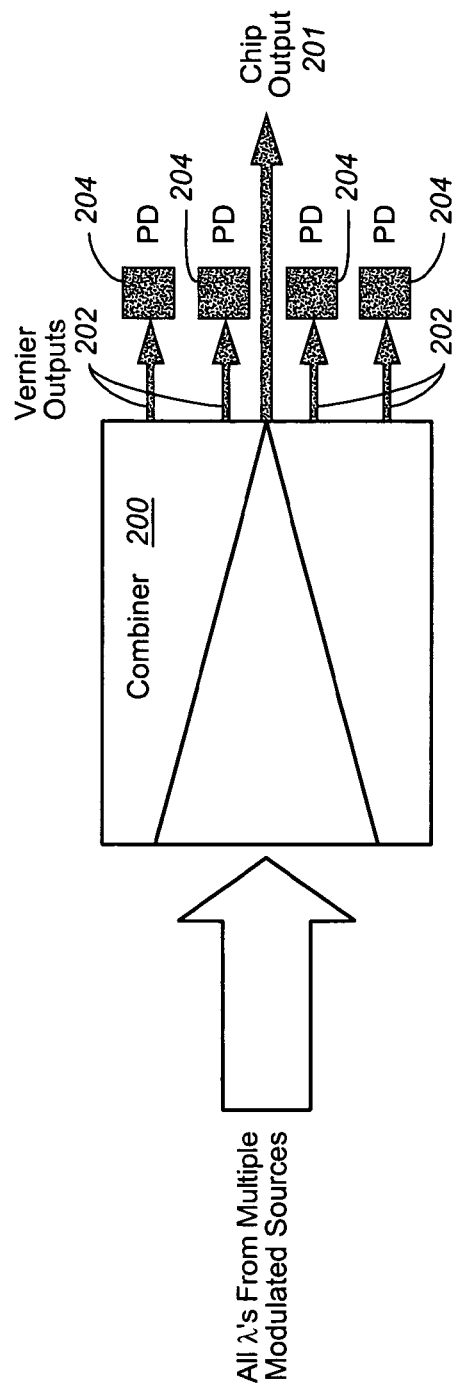
FIG._20

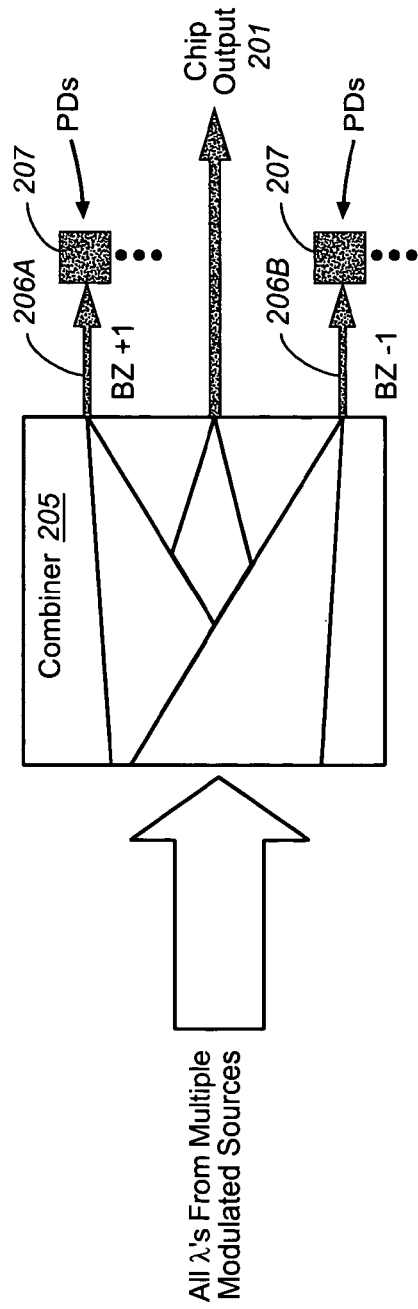
FIG._21
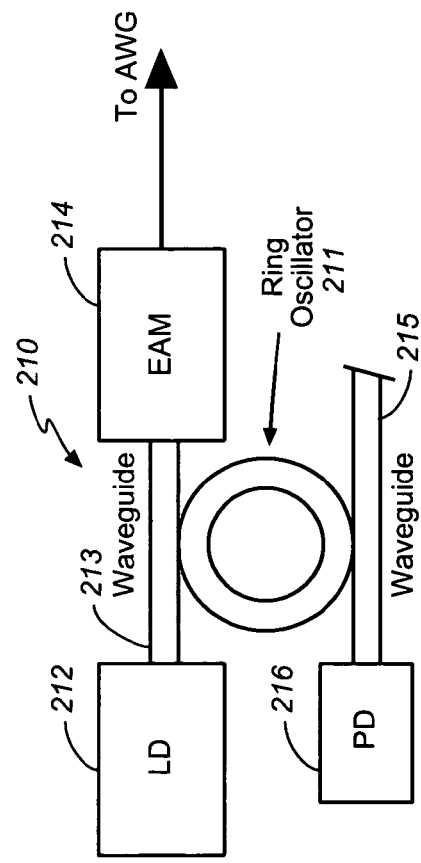
FIG._22

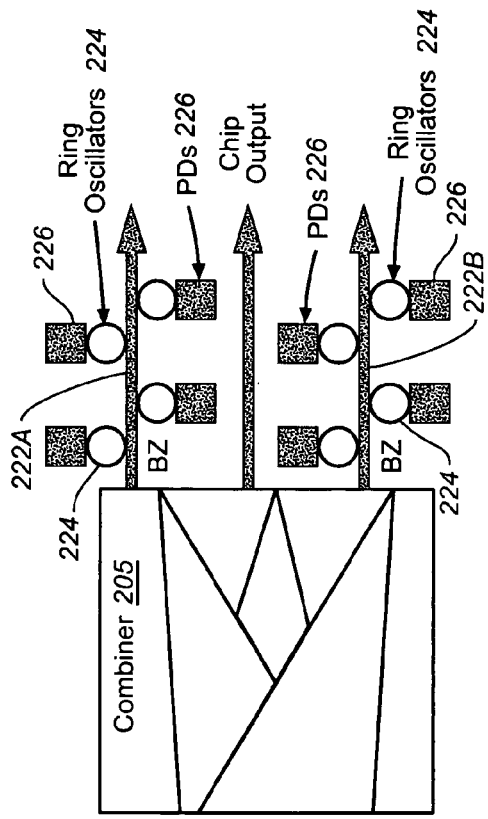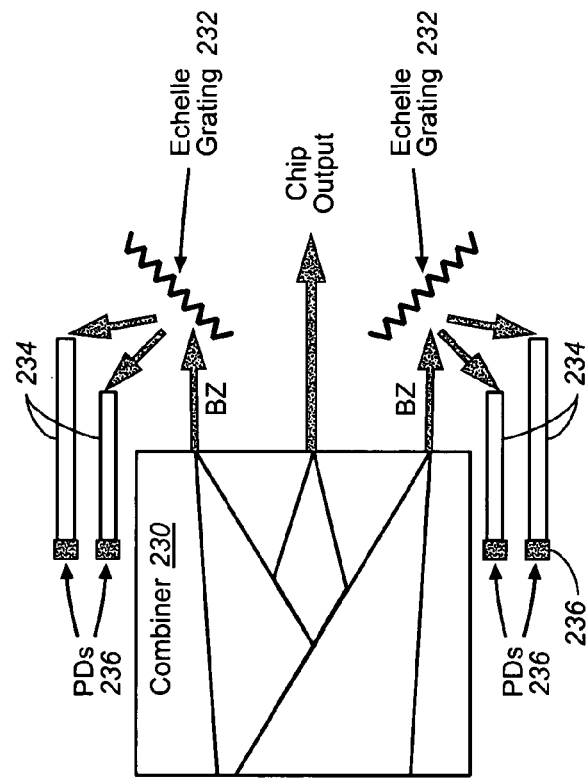
FIG._23  FIG._24

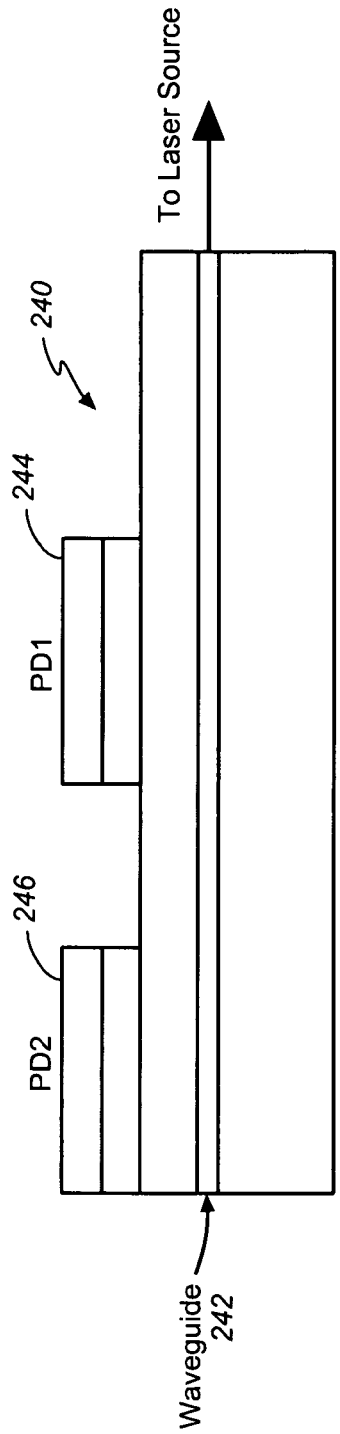
FIG._25
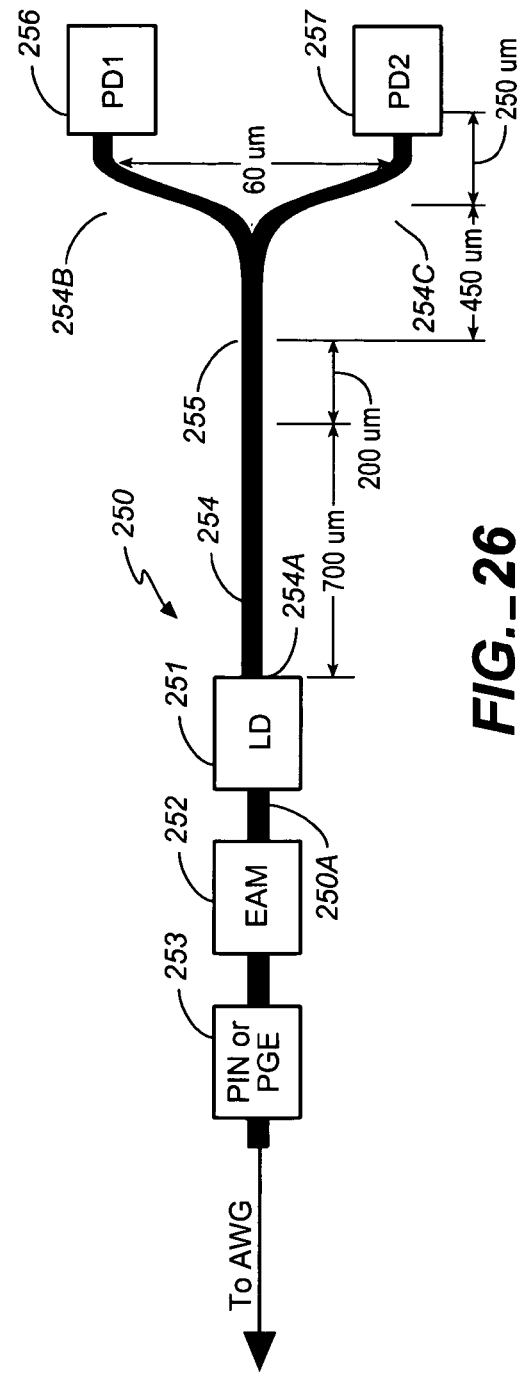
FIG._26

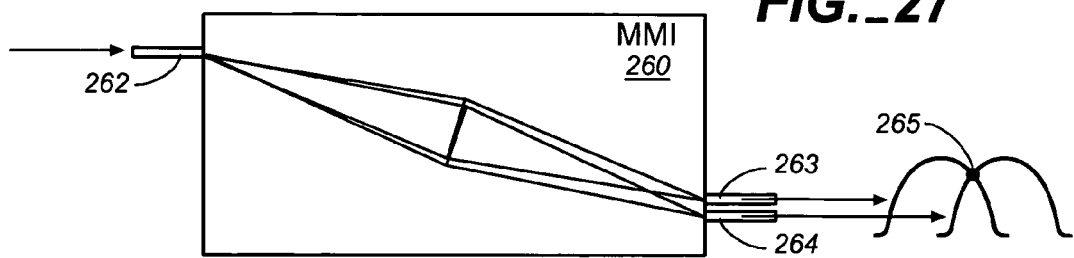
FIG._27
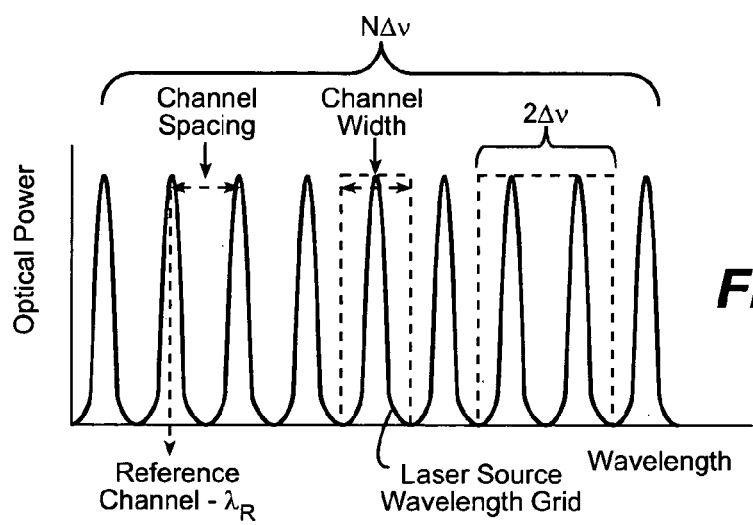
FIG._28
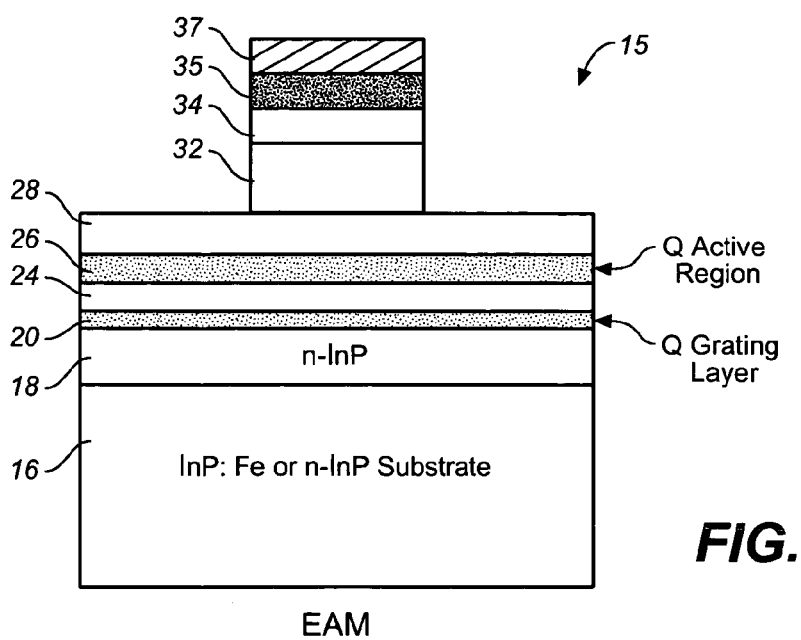
FIG._29

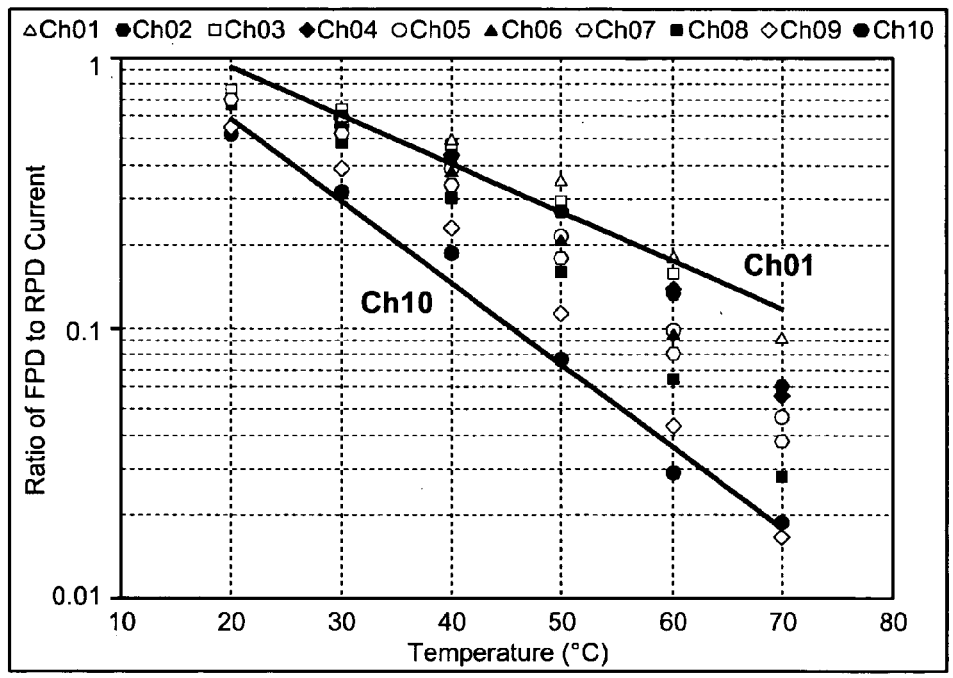
FIG._30
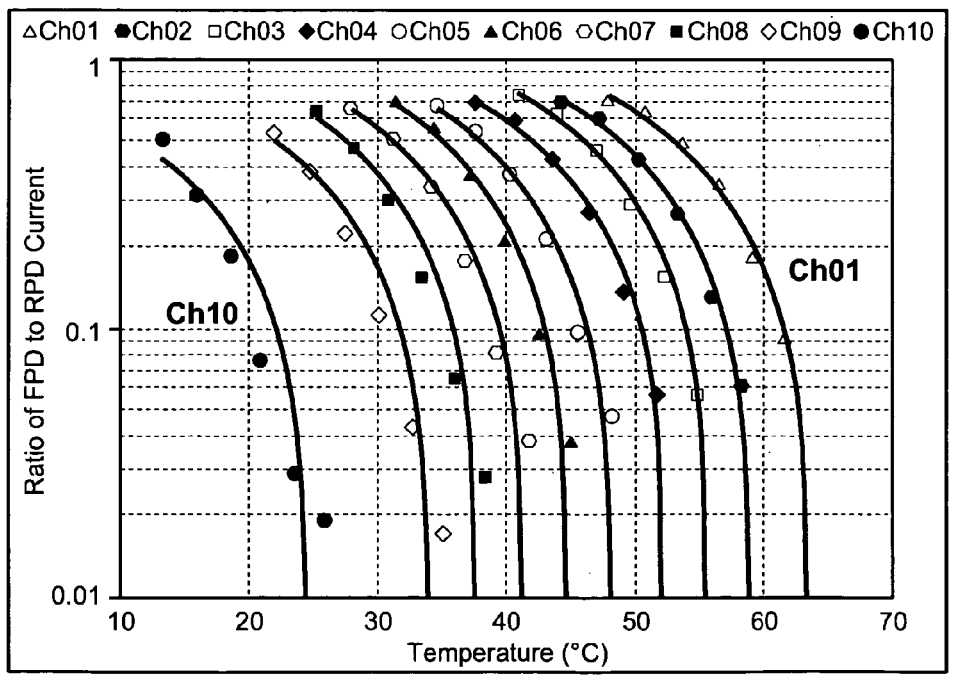
FIG._31

COOLERLESS PHOTONIC INTEGRATED CIRCUITS (PICS) FOR WDM TRANSMISSION NETWORKS AND PICS OPERABLE WITH A FLOATING SIGNAL CHANNEL GRID CHANGING WITH TEMPERATURE BUT WITH FIXED CHANNEL SPACING IN THE FLOATING GRID

CROSS REFERENCE TO RELATED APPLICATION

This application is a divisional of U.S. Ser. No. 11/106,875, filed Apr. 14, 2005, now U.S. Pat. No. 7,636,522 which claims priority to U.S. provisional application Ser. No. 60/563,161, filed on Apr. 15, 2004, each of which is incorporated herein by reference in their entirety.

This invention was made with Government support under Contract Number W31P4Q-04-C-R074 awarded by the U.S. Army Aviation and Missile Command. The government has certain rights in the invention.

FIELD OF INVENTION

This invention relates generally to photonic integrated circuits (PICs) and more particularly to uncooled PICs operating as WDM transmitters or receivers and also particularly such PICs that operate with a floating wavelength grid of signal channels where the spatial separation between the signal channels is continuously maintained fixed.

DEFINITIONS

In order to better understand the disclosure, the following definitions are offered relative to certain terminology that is employed throughout this disclosure:

The term, "modulated sources", includes directly modulated lasers and cw lasers with external modulators or any element or elements that provide a modulated signal at a given wavelength. The term, "external", as used in the art in this context means "independent or separate from" the laser and the modulator is an integrated device on the same substrate with the laser.

Lasers or laser sources are the same element.

An "element", which is synonymous with "component", means any active or passive optical device integrated on a photonic integrated circuit (PIC) that performs a function on the PIC. Examples include, but not limited to, a laser, modulator, PCE, MFE, an element with a fixed insertion loss which can be fixed or set at a bias, a waveguide, a combiner or decombiner, a coupler, or splitter.

Reference to "WDM" is intended to include "DWDM" and "CWDM". The term "channels" or "signal channels" has general reference to modulated sources on the PIC chip, such that if there are N signal channels, then there are N modulated sources. Reference in this description to circuit-integrated laser source/modulator signal channels is nominally a laser source and its associated modulator together comprising a modulated source and providing a modulated signal output. In this context, such a channel is also functions as an optical waveguide.

"Active region" as employed in the description in this application means the region in a semiconductor device where carrier recombination occurs which may be comprised of a single semiconductor active layer or multiple semiconductor layers with any associated optical confinement layers, as is well known to those skilled in the art.

A "channel" means an integrated, optical signal channel waveguide path in a single-channel EML or in a multiple channel PIC that minimally includes a modulated source or other active element, such as a photodetector (PD), for propagation of an optical signal and where, in the photonic integrated circuit (PIC), there are N signal channels formed in an array across the PIC where N is two or greater and or in an EML there is N=1.

A "combiner or decombiner" means a wavelength selective combiner or decombiner and a free space combiner or decombiner. A "wavelength selective combiner or decombiner" is a wavelength discriminating combiner or multiplexer of wavelength channel signals. A "free space combiner/decombiner" is a wavelength indiscriminate combiner with respect to combining different wavelength channel signals. More particularly, the output power, in units of dBs, from a wavelength selective combiner may be defined as $$\sum_i^N P_i - IL,$$

where $P_i$ is the optical input power into the combiner, N is the number of outputs and IL is the insertion loss factor. For the free space combiner, it is typically defined as $$\sum_i^N P_i/N - IL,$$

where $P_i$ is the optical input power to the combiner and N is the number of inputs and IL is the insertion loss factor. It can readily be seen that the difference power output is the prime difference. Examples of wavelength selective combiners/decombiners are, but not limited to, an arrayed waveguide grating (AWG), an Echelle grating, a cascaded Mach-Zehnder interferometers, a quasi-wavelength selective star coupler or an elliptical supergrating. Examples of free space combiners/decombiners are, but not limited to, a multimode interference (MMI) coupler, free space coupler, star coupler or any such optical coupler with a multimodal coupled region.

As employed in this description, a photonic integrated circuit (PIC) may be any semiconductor device, including a silicon device, which has at least two elements integrated in an optical circuit. Thus, a PIC can be an EML, TxPIC, RxPIC or any other circuit with a plurality of elements, passive or active, formed in the circuit.

"Laser emission wavelength" means emission output wavelength of a laser or lasers.

"Active region wavelength" means the wavelength of the photoluminescence peak or the gain peak in am active region of element of in a signal channel formed in a photonic integrated circuit (PIC), such as, for example, an active region of a laser source, a modulator, a monitoring element such as a photodetector or an power changing element (PCE) such as a semiconductor optical amplifier (SOA), a variable optical attenuator (VOA) or a variable gain/loss element such as a combination SOA/VOA device.

"Spectral spacing ($\Delta\lambda$)" means the difference in laser emission wavelengths between adjacent signal channels in a photonic integrated circuit (PIC) or between discrete modulated sources.

"Laser detuned offset" means the difference between laser emission wavelength and the laser active region wavelength for a signal channel.

"Positive wavelength detuning" or "positively detuned wavelengths" means the laser detuned offset that is greater than zero. As used herein, "positive wavelength detuning" can also include slightly negative wavelength detuning, i.e., just below zero, since in fabricating PICs, it is possible that intended positively detuned wavelengths can end up slightly negatively detuned by a few nanometers.

"Laser-modulator detuning" means the difference between the laser emission wavelength, and the modulator active region wavelength relative to the same signal channel.

"Operation window" means the range of laser source channel emission wavelengths over which there is acceptable loss and acceptable bit error rate (BER) performance of the modulated sources for a particular specified application of the PIC.

"PCE" means a power changing element (a power varying element or a fixed loss element) integrated in one or more of the channels of a photonic integrated circuit (PIC) that changes the power level of the light propagating through the element. Examples of PCEs are photodetectors, semiconductor optical amplifiers (SOAs), variable optical attenuators (VOAs), or combination SOAs/VOAs which may also be referred to as ZOAs, $\Delta$-$\beta$ coupler, a Mach-Zehnder interferometer that changes the phase of light split between the interferometer arms, or the deployment of an absorption region of a predetermined length formed in the signal channel.

The wavelength grid of a plurality of modulated sources as well as the wavelength grid of a combiner or decombiner is also referred to as a "wavelength comb".

A "slew rate" is defined as a rate related to how rapidly the wavelength grid moves or changes in frequency in a coolerless (heated) ambient, which can be measure in nm/° C. or GHz/° C. As an example, on a TxPIC described herein, the laser sources slew rate is around 16.5 GHz/° C. such as in an ambient between approximately room temperature and approximately 70/° C.

DESCRIPTION OF THE RELATED ART

For long haul optical telecommunications in the past, the optical transmitter has primarily been comprised of optically fiber coupled discrete semiconductor laser sources and discrete external modulators. In most cases, the laser source of choice has been the DFB laser and the modulator of choice has been the Mach-Zehnder lithium niobate modulator. More recently, the integration of these two components have come into common commercial reality comprising a monolithic DBR or DFB laser/electro-absorption (EA) modulator (EAM) integrated on the same substrate. The laser source of choice in most cases has been the DFB laser. These devices are also referred to as an EML (electro-absorption modulator/laser). It is highly desirable to monolithically integrate an EA modulator with a single-frequency laser, such as a DFB or DBR laser. Such externally modulated laser sources, such as an EA modulator, are more attractive than direct modulated laser sources because of their intrinsic low static chirp. These EMLs have the advantage over previous discrete laser/modulator devices in that (1) coupling or insertion losses between the laser and modulator are reduced or negligible achieving stable and reliable modulation sources, (2) laser chirp due to, at least in part, of feedback reflection from the laser/modulator interface or the modulator facet is reduced, if not negligible, and (3) costs in producing such an integrated device are lower.

EMLs generally employ multiple quantum wells (MQWs) in the device's active region. The issue in fabricating these integrated devices, however, is that the MQWs for the modulator section are required to have a wider effective bandgap than the MQWs for the laser section. This can be difficult if the integrated laser section and the modulator section have the a common active region because the initial belief was that in order to achieve the necessary bandgap between these sections, the respective active regions of these devices had to be made with effectively different bandgaps.

Electro-absorption modulator/laser (EML) devices are now being deployed in transmitter systems for optical transmission networks with bit rates up to 10 Gb/s. These devices are generally an integrated DFB laser and electro-absorption modulator and provide for improved performance due to their integration and lower package costs. The improved performance at the modulator is augmented by the achievement of high extinction ratios and low chip characteristics. The waveguide cores in EMLs or arrays of modulated sources are preferably AlInGaAs multiple quantum wells (MQWs), which we abbreviate to AQ MQWs as opposed to InGaAsP MQWs or PQ MQWs, improve laser performance at elevated temperatures. See, for example, the article of M. R. Gokhale et al. entitled, "Uncooled, 10 Gb/s1310 nm Electroabsorption Modulated Laser", *Optical Fiber Communication Conference & Exposition* (OFC 2003), Post-deadline (PD) paper 42, pp. 1-3, Mar. 23-28, 2008. This paper reports a 10 Gb/s1310 nm EML with AQ twin-waveguides that operates uncooled from 0° C. to 85° C. with fairly maintained average power and modulator extinction ratio over the foregoing temperature range. The deployment of the twin waveguides requires additional growth steps and a good and high yield-reproducible coupling mechanism between the DFB laser and the EAM. Simpler approach is a single active region/waveguide core for the laser and the modulator, although, as recognized in the art, back reflections from the modulator into the laser can be an issue but can be dealt with. Thus, 1550 nm lasers have all been cooled, such as, for example, with a thermal electric cooler (TEC) upon which the laser is mounted.

In some current EMLs, the DFB laser grating is designed to have a longer grating period than the wavelength of the active region material gain peak which is referred to as positive detuning and, in some cases, may be even slightly negatively detuned.

In the article of Randal A. Salvatore et al. entitled, "Electroabsorption Modulated Laser for Long Transmission Spans", *IEEE Journal of quantum Electronics*, Vol. 28(2), pp. 464-476, May 2002, discloses a cooled (to 25° C. or room temperature, for example) 1550 nm range EMLs with a complex-coupled AQ active region/waveguide. Thus, 1.5 μm AQ EMLs are known but are not operated uncooled, i.e., they include a thermo-electric cooler (TEC).

What is desired is a 1500 nm range EML that can operate uncooled over a wide temperature range above and below room temperature while providing substantially uniform power output over such a temperature range.

Reference is now made to U.S. patent application Ser. No. 10/267,331. also Pub. No. US 2003/0095737 A1; Ser. No. 10/267,304, also Pub. No. US 2004/0033004 A1; Ser. No. 10/267,330 also Pub. No. US 2003/0095736 A1; Ser. No. 10/267,346, also Pub. No. US 2003/0081878 A1, all filed Oct. 8, 2002, owned by the assignee herein and incorporated herein in their entirety by their reference. These applications disclose the first photonic large scale integration (P-LSI)-based photonic integrated circuits (PICs). The InP-based, optical transmitter photonic integrated circuit (TxPIC) formed in these chips comprises an array of modulated sources, which may be an integrated array of direct modulated lasers (DMLs) or may be an integrated array of laser sources with corresponding, optically coupled, integrated electro-optic modulators (EOMs), such as EAMs. In either case, they include an array of laser sources, for example, DFB lasers or DBR lasers. The respective laser sources operate at different wavelengths which are respectively set to wavelengths on a standardized wavelength grid, such as the ITU grid. Thus, each of the modulated signals from each laser source/modulator (also referred to as "modulated sources", which also is intended to include directly modulated lasers in such signal channels) is a signal channel with a frequency different from other signal channels—all integrated on a single chip. The channel signals are provided as inputs to an integrated optical combiner which may be a wavelength selective combiner or filter such as an arrayed waveguide grating (AWG), an Echelle grating, a cascaded Mach-Zehnder interferometer or a quasi-selective wavelength star coupler. On the other hand, the optical combiner may be a power coupler, star coupler or a MMI coupler. Examples of the foregoing can be seen in the above identified incorporated applications, in particular, U.S. application Ser. No. 10/267,331, supra.

The InP-based, optical receiver photonic integrated circuit or RxPIC comprises a semiconductor chip having an input for a multiplexed signal, which signal may be first amplified by an off-chip EDFA or by an on-chip optical amplifier. The signal may then be demultiplexed by an on-chip decombiner or filter where the multiple output waveguides from the decombiner comprise a plurality of different modulated optical signals with the terminus of each waveguide coupled to a respective on-chip, integrated photodetector, such as PIN photodiode. The photocurrent signals from the photodetectors are provided to a transimpedance amplifier (TIA) for conversion of each of the photocurrents to a voltage signal which is an electrical rendition of the optical signal. Such a TIA may be an integrated part of the RxPIC chip. More details and examples relating to RxPIC chips is disclosed in U.S. patent application Ser. No. 10/267,304, supra.

In a conventional dense wavelength division multiplexed (DWDM) communication system available today from telecommunication service provider equipment manufacturers, the generation of a lot of heat is commonplace and is a major limitation to decreasing the size, power and cost of these system. The use of monolithically integrated photonic devices, such as EMLs, TxPICs and RxPICs discussed above, which incorporate multiple functions into a single semiconductor chip, can significantly reduce the overall power requirements of an optical transmitter module. The large-scale integration of these types of photonic integrated circuits (PICs) provides a large increase in functionality with an associated significant reduction in overall power, weight, size and cost. Although integration has been demonstrated to reduce power consumption, the thermo-electric cooler (TEC) or a Peltier cooler employed to cool these PIC chips can use up four to ten times as much power as the chip or chips itself that are being cooled to operate at a designated temperature. This large power consumption via the use of such coolers significantly diminishes the effects of improvements made in device power requirements of such large-scale integration devices. Furthermore, the additional power utilized by the TEC increases the required heat sink size, weight and cost, often exponentially. Thus, there is a major reason, as well as technical challenge, to remove the requirement for a TEC in such PICs.

The major challenge in realizing an uncooled DWDM optical transmitter is control of the operating wavelength of the multiple on-chip laser diodes. DWDM implies an accurate control of the transmitter wavelength, whereas changing environmental temperature in a TxPIC, for example, inherently works also to change the wavelength of the on-chip laser diode transmitters. It is an object of this invention to deploy a new and dramatic DWDM system approach, together with novel sensing schemes and adaptive algorithms to provide intelligent control of PIC chips such as EMLs, TxPICs or RxPICs in an optical transponder or transceiver module to optimize its performance and to allow these semiconductors to operate uncooled on a continuous basis. Control of the high speed performance parameters, like the transmitter chirp, is also required in order to insure a satisfactory quality data transmission.

OBJECTS OF THE INVENTION

It is an object of this invention to eliminate or substantially reduce the foregoing discussed problems in this art.

It is a further object of this invention to provide a PIC that requires no cooling and yet meets required performance criteria and provides for inexpensive packaging since a packaged cooler, such as an expensive TEC (thermo-electric cooler), is not required and the requirements for a hermetically sealed package are substantially relieved, if not eliminated.

It is another object of this invention to provide an array of lasers integrated in a PIC for operation over an extended relatively high temperature operating range, as opposed to or compared to room temperature, where the minimum temperature of the range is maintained by PIC integrated circuit heaters to maintain the operational wavelengths of the respective lasers, but at higher operating temperatures, i.e., above the minimum temperature and within the high temperature operating range where the heaters are employed to tune the laser wavelengths to be within a predetermined frequency spacing relative adjacent lasers in the array.

It is another object of this invention to provide a PIC for operation over an extended temperature range, such as, but not limited to, of about −20° C. to some less than 100° C., more particularly in a range of about 20° C. to about 70° C.

It is another object of this invention to provide an array of integrated array of lasers, such as an array of EMLS or an array of laser sources in a PIC, that are not temperature-controlled so that the comb of wavelengths comprising the optical outputs of the laser array are permitted to drift within a temperature operating range. However, the wavelength spacing between adjacent lasers in the array are maintained at a constant value, i.e., the comb of wavelengths of the laser array are locked to a fixed frequency spacing where such a spacing among the array lasers may be uniform or nonuniform.

It is another object of this invention to provide an adaptive optical receiver to identify the floating grid of signal wavelengths upon demultiplexing and identifying the signal channels via the fixed spacing of a comb of transmitted and floating wavelengths, tuning to the respective floating wavelengths representing the signal channels and tracking the floating grid of signal wavelengths while the respective channel signals are converted from the optical domain into the electrical domain at the optical receiver.

Another object of this invention is a feedback system that monitors and locks the comb of wavelengths of an array of integrated laser sources on a PIC with fixed wavelength spacing between adjacent laser sources while the ambient PIC temperature changes over a broad temperature operating range so that the operating wavelengths of the individual laser sources, with a fixed grid because of their fixed channel spacing, may change with temperature over a temperature operating range.

It is another object of this invention to provide wavelength detectors that are integrated in a photonic integrated circuit or PIC that are employed to detect output signal wavelengths from active or passive devices, such as laser sources in a TxPIC or EMLs or from a wavelength selective decombiner in a RxPIC.

Other objects will become apparent throughout the remaining description of the invention.

SUMMARY OF THE INVENTION

According to this invention, a PIC, such as an EML, TxPIC and RxPIC, are allowed to be operated uncooled and unheated or heated over a wide temperature range so that expensive packaging, such as requiring a hermetically sealed package and TEC submounts with an accompanying cooler, can be in many cases can be suppressed, if not eliminated, in use for their operation in an optical transponder or transceiver module in an optical transport or communication network, whether for long haul, metro or WAN or LAN. The major challenge to realizing an uncooled WDM transmitter is control of operating wavelengths, such as in DWDM systems, as understood today, implies an accurate control of transmitter wavelengths, whereas environmental changes in temperature inherently operate to change the wavelength of the transmitters. This invention is directed to a new DWDM system approach with novel sensing schemes and adaptive algorithms that provide for intelligent control of the PIC to optimize its performance and to allow optical transmitter and receiver devices in DWDM systems to operate uncooled. Control of the high speed performance parameters, such as transmitter chirp, still continually insures that a satisfactory quality data transmission is realized.

Another important feature of this invention is the provision of an optical transmitter and an optical receiver for deployment in an optical transmission network at a terminal end, as a mid-span optical regenerator or repeater (OEO regeneration), or as a mid-span add/drop/pass-through module where the operating wavelengths of the optical transmitters are floating, i.e., the operating wavelengths are not held to approximate a wavelength on a standardized grid but rather can move higher or lower with increasing or decreasing temperature, respectively, but the wavelength grid of the group of optical transmitters remains the same and is held constant, such as at a 50 GHz, 100 GHz or 200 GHz spacing. This principal can apply equally as well to current and conventional optical transponders now deployed, such as those employing discrete lasers and external modulators at the optical transmitter or photodetectors at the optical receiver as well as employing channel EMLs.

Thus, the floating wavelength grid principal of multiple wavelength signal channels as disclosed in this application is not only applicable to EMLS or PICs but also equally applicable to present day transponders having large cooling systems to maintain the transmission channel wavelengths approximate to a predetermined or established wavelength grid, such as the ITU grid. Therefore, this invention is a significant and unheard of departure from previous well established standards requiring the wavelength operation of individual optical transmitters in a network channel signal generator must be maintain within a small nanometer range of designated wavelength positions along a wavelength grid such as wavelengths in the C band. To the contrary, the wavelength positions of the channel signal generator signal channels of this invention are allowed to move up or down with temperature within a temperature range, such as within the C band or into other such bands, such as the L band, as long as the wavelength grid spacing of the signal channels remains fixed. In this connection, the fixed spacing between all signal channels may uniform or identical, or they can be non-uniform within a predetermined pattern such as, some signal channels having a greater spacing than other signal channels, or monotonically increasing or decreasing in special relation, again, as long the wavelength spacing between adjacent signal channels across the floating wavelength grid of transmitter wavelengths remains continually and substantially fixed.

Another feature of this invention is a coolerless, semiconductor electro-absorption modulator/laser (EML) or EMLs, or an array of modulated sources integrated in a photonic integrated circuit (PIC), such as an optical transmitter PIC (TxPIC), with each EML comprising an integrated CW operated laser source and an electro-optic modulator, such as an electro-absorption modulator (EAM) or a Mach-Zehnder modulator, where an active region, as formed in the EML or PIC for guiding light generated by the cw-operated laser source through a formed waveguide core, contains the quaternary AlGaInAs (AQ) and the laser source or sources are positively detuned relative to the natural photoluminescence (PL) peak or gain peak of the active region material. As a result, the EML or TxPIC can operate over a wide temperature range without required ambient cooling a provide a substantially uniform output power and laser threshold current over a wide temperature range, in particular, a wide high temperature range, such as from around room temperature to some temperature below 100° C., such as in the range of about 20° C. to about between 70° C. to 85° C.

It is another feature of this invention to provide a Group III-V based PIC (e.g., EML, TxPIC or RxPIC), such as an InP-based PIC with two or more integrated elements, operated without a PIC cooler and employing a heater to maintain a fixed operating point or set operating condition for the PIC. The heater for the PIC is applied to at least one element on the PIC, such as a laser, modulator, semiconductor optical amplifier (SOA, variable optical attenuator (VOA), wavelength selective combiner/decombiner or filter or any other power changing element (PCE) integrated in the PIC.

A further feature of this invention is a PIC which includes an integrated wavelength detector for detecting an output wavelength from one or more elements also integrated on the PIC. In this regard, the detector may be employed as integrated wavelength locker for wavelength stabilization or wavelength grid stabilization. Thus, this feature comprises a PIC that includes an integrated wavelength control element which is integrated in the PIC with other integrated PIC elements. Such a PIC can be operated either coolerless (heated) or with a cooler, such as a TEC.

Other objects and attainments together with a fuller understanding of the invention will become apparent and appreciated by referring to the following description and claims taken in conjunction with the accompanying drawings in which like numerals indicate like structural elements and features in various drawings. The drawings are not necessarily to scale with emphasis placed upon illustrating the principals of the invention.

BRIEF DESCRIPTION OF THE DRAWINGS

In the drawings wherein like reference symbols refer to like parts:

FIG. 1 is a plan view of a coolerless PIC comprising a coolerless electro-absorption modulator/laser (EML) comprising this invention.

FIG. 2 is side elevation of the EML of FIG. 1.

FIG. 3 is cross-sectional view of the EML taken along the line 3-3 in FIG. 2.

FIG. 4 is a graphic illustration of the average power versus ambient temperature for a plurality of EMLs showing substantial uniformity in output power over a large operating temperature range.

FIG. 5 is a graphic illustration of the average laser threshold power versus ambient temperature for a plurality of EMLs showing substantial uniformity in threshold current over a large operating temperature range.

FIG. 6 is a plan view another embodiment of a coolerless PIC comprising a coolerless EML shown in FIG. 1 which includes a strip heater for the EML.

FIG. 7 is a plan view of further embodiment of a coolerless PIC comprising a coolerless EML shown in FIG. 1 which includes a power changing element (PCE) comprising an integrated semiconductor optical amplifier (SOA).

FIG. 8 is a plan view of a coolerless PIC comprising an optical transmitter photonic integrated circuit (TxPIC) employing the features of this invention.

FIG. 9 is a plan view of a coolerless PIC comprising an optical receiver photonic integrated circuit (RxPIC) employing the features of this invention.

FIG. 10 is schematic illustration of a first embodiment of an optical transmission network having multi-channel PICs utilizing a floating wavelength grid comprising this invention.

FIG. 11 is schematic illustration of a second embodiment of an optical transmission network having multi-channel PICs utilizing a floating wavelength grid comprising this invention.

FIG. 12 is schematic illustration of a third embodiment of an optical transmission network having multi-channel PICs utilizing a floating wavelength grid comprising this invention.

FIG. 13 is a schematic illustration of a first embodiment of an on-chip wavelength detector integrated in a PIC.

FIG. 14 is a schematic illustration of a second embodiment of an on-chip wavelength detector integrated in a PIC.

FIG. 15 is a schematic illustration of a third embodiment of an on-chip wavelength detector integrated in a PIC.

FIG. 16 is a schematic illustration of a fourth embodiment of an on-chip wavelength detector integrated in a PIC.

FIG. 16 is a schematic illustration of a fifth embodiment of an on-chip wavelength detector integrated in a PIC.

FIG. 17 is a schematic illustration of a sixth embodiment of an on-chip wavelength detector integrated in a PIC.

FIG. 18 is a schematic illustration of a seventh embodiment of an on-chip wavelength detector integrated in a PIC.

FIG. 19 is a schematic illustration of an eight embodiment of an on-chip wavelength detector integrated in a PIC.

FIG. 20 is a schematic illustration of a ninth embodiment of an on-chip wavelength detector integrated in a PIC.

FIG. 21 is a schematic illustration of a tenth embodiment of an on-chip wavelength detector integrated in a PIC.

FIG. 22 is a schematic illustration of an eleventh embodiment of an on-chip wavelength detector integrated in a PIC.

FIG. 23 is a schematic illustration of a twelfth embodiment of an on-chip wavelength detector integrated in a PIC.

FIG. 24 is a schematic illustration of a thirteenth embodiment of an on-chip wavelength detector integrated in a PIC.

FIG. 25 is a schematic illustration of a fourteenth embodiment of an on-chip wavelength detector integrated in a PIC.

FIG. 26 is a schematic illustration of a fifteenth embodiment of an on-chip wavelength detector integrated in a PIC.

FIG. 27 is a schematic illustration of a sixteenth embodiment of an on-chip wavelength detector integrated in a PIC.

FIG. 28 is a graphic illustration of an example of a wavelength grid or comb of multiple laser sources such as in a TxPIC.

FIG. 29 is a cross-sectional view of an electro-optic modulator in a PIC, such as an EML or TxPIC, with a heater mounted on the top of the ridge waveguide of the electro-optic modulator.

FIG. 30 is a graphic, semi-log illustration of the ratio of the front photodetector (FPD) or front PIN photodiode or FPIN photocurrent to the rear photodetector (RFD) or rear PIN photodiode or BPIN photocurrent across a ten signal channel TxPIC as a function of temperature.

FIG. 31 is a graphic, semi-log illustration of ratio of the front photodetector (FPD) or front PIN photodiode or FPIN photocurrent to the rear photodetector (RFD) or rear PIN photodiode or BPIN photocurrent across a ten signal channel TxPIC as a function of temperature via a linear fit.

DETAILED DESCRIPTION OF THE INVENTION

Reference is now made to FIGS. 1-3 which are directed to a coolerless PIC in the form of a coolerless electro-absorption modulator/laser or EML 10 comprising this invention. EML 10 comprises, in monolithic form, an integrated laser source 12 and an electro-absorption modulator (EAM) 14. Laser source 12 may be a DFB or DBR laser but a DFB laser is preferred in the embodiments here. EML 10 is provided with a shallow ridge waveguide 36, as seen in FIG. 3. However, the ridge can also be a deep ridge waveguide device, rib-loaded waveguide, or buried heterostructure waveguide.

It should be noted for the purposes of this invention, the modulator 14 may also be a Mach-Zehnder modulator (MZM), an example of which is disclosed in incorporated patent Ser. No. 10/267,331, supra. A MZM may be a "pure" MZM, i.e., one not operated near its bandedge, or may be a bandedge MZM, i.e., one operated at its bandedge. In the former case, a coolerless operation using a heater for the pure MZM is not required. However, it may be still desirable to operate a pure MZM in an uncooled state (coolerless environment), such as in a case to control modulator chirp. In the case of a bandedge MZM, a coolerless operation using a heater is required to maintain its operation within the bandedge since the wavelength can vary rapidly with temperature when operating along the bandedge so that power will fall and collapse if tight temperature control is not maintained.

As shown in FIGS. 2 and 3, coolerless EML 10 may be comprised of an n-InP type or semi-insulating (InP:Fe) substrate 16 upon which is epitaxially deposited, such as by MOCVD, an n-InP buffer layer (not shown), an n-InP confinement layer 18, followed by a quaternary ("Q") grating layer 20, which may be InGaAsP ("PQ") or AlInGaAs ("AQ"). A DFB grating 22 is formed in Q grating layer 20 in the region of laser source 12, as conventionally known and carried out in the art. The structure shown further includes a n-InP planarization/separation layer 24 followed by active region 26 comprising AQ, i.e., AlInGaAs which can be a bulk layer but more preferably is a plurality of strained quantum wells and barriers where there may be, for example, about 4 to 6 such quantum wells. An optional planarization layer 28 of non-intentionally doped (NID) InP may be provided and followed with an optical NID layer 30 of InP, AlInAsu, InAlGaAs, InAlAsP or InAlGaAsP is grown which functions as a stop etch layer forming the shallow ridge waveguide 36. This is followed by the growth of p-InP confinement layer 32 and contact layer 34 of $p^{++}$-InGaAs as is known in the art.

While an InP-based regime has been exemplified above, other Group III-V regimes may be employed including a GaAs-based regime.

Appropriate separate metallizations (not shown) are formed on the surfaces of contact layer 34 which contacts are electrically isolated by means of isolation region 35. Isolation region 35 may be a groove or an ion implant, for example, as known in the art. An n-contact metallization (not shown) is provided on the bottom surface of substrate 16.

The waveguide core formed in active region 26 is preferably AlInGaAs or AQ which provides for high temperature operation of DFB laser source 12 as well as provides for a wider modulator window for the bandwidth of possible laser emission wavelengths, particularly for a multi-channel/multi-wavelength PIC. The laser source 12 is largely, positively detuned, i.e., the grating pitch 22 of DFB laser 12 is chosen such that the laser operates on the longer wavelength side of the gain peak or the PL peak of active region 26. This detuning provides for laser performance to be substantially uniform over a wider temperature range, in particular, the laser gain is maintained or actually increases some with increasing operating or ambient temperature. Laser 12 is fabricated to operate at a positive detuned wavelength, for example, in the range of about 60 nm to about 100 nm from the gain peak. The laser detuned emission wavelength is close to the absorption edge of the modulator AQ active waveguide core thereby insuring optimal wavelength compatibility between laser 12 and EAM 14 without significantly degrading the performance of the laser source due to the application of positive detuning. In other words, the laser-modulator detuning relative to the emission wavelength of laser 12 with respect to the transmission wavelength of EAM 14 is red-shifted. A wide gain spectrum in the operation of laser source 12 is achieved due to the employment of strained multiple quantum well layers in laser active region 26. This detuning of DFB laser 12 plus the deployment of the negative chirp regime at EAM 14 provides for initial modulated pulse compression permitting the extended transmission of the optical signal over high dispersion fibers thereby resulting in lower BER over comparative lengths of such fibers. The net result is that laser power output and laser threshold current does not change much over a fairly wide temperature range as illustrated, respectively, in the graphs of FIGS. 4 and 5. The graphic data in FIGS. 4 and 5 is the average results for a number of EML PICS, in particular, sixty such devices. It can be seen from the results relative to curve 38 in FIG. 4 that the output power of these devices varied between 14 mW and 15 mW, i.e., within about 1 mW over a wide operating temperature range from 15° C. to 40° C. By the same token, as seen in FIG. 5, relative to curve 39, threshold current over this temperature range varied only about 5 mA. Thus, it can be seen that substantially uniform power and laser threshold current is achieved over about a 25° C. temperature range without the application of any ambient cooling when EML 10 is fabricated with AQ active regions and where the laser emission wavelength is positively detuned relative to the active region wavelength and the laser emission wavelength is within the wider-provided modulator operation window.

Also, a further benefit that is achieved is that as the detuning of the EAM 14 and the lasing wavelength (the laser-modulator detuning) is reduced, the frequency chirp characteristics are improved resulting in a lower BER.

Further, reduced positive detuning of laser source 12 will shift toward the PL peak and the PL peak will also shift toward the detuned laser operating wavelength with an increase in device temperature which is beneficial since the laser gain will correspondingly increase as the ambient temperature increases. Thus, an increase in ambient temperature of EML PIC 10 results in a bandgap shift of active region 26 of DFB laser 12, reducing the detuning of the gain peak toward the lasing or operating peak of laser 12, resulting in higher gain. As previously indicated, the net result of power output and laser threshold current remains little changed over a wide operating temperature range as seen from the results in FIGS. 4 and 5. As the ambient temperature of EML 10 increases, the gain of the laser will move toward the PL peak, e.g., typically at a rate of about 0.16 nm/° C., as well as the PL spectrum will move toward the positively detuned laser emission wavelength, e.g., typically at a rate of about 0.5 nm/° C., with a net result of increasing laser gain with increasing laser temperature. Thus, as EML 10 heats up, the laser operating gain increases toward the photoluminescent (PL) peak whereas the net effect of most other lasers not having the attributes set forth in this application is that laser gain will decrease with increasing temperature. Such lasers are usually tuned to the photoluminescent peak or negatively detuned so that with increasing temperature, laser gain will fall off at higher temperatures. Thus, positive detuning is an important aspect of this invention in providing for laser/modulator wavelength compatibility as well as capable of increasing gain or at least stabilizing gain as the EML PIC operation temperature increases.

An additional feature which may be provided to the embodiment of FIGS. 1-3 is the addition of a heater 33 to EML PIC 10 as illustrated in FIG. 6. The inclusion of heater 33 in close proximity to the PIC active elements minimizes the temperature excursion of EML PIC 10A. As shown in FIG. 6, EML PIC 10A includes a strip heater 33 along the side of both integrated electro-optic elements 12 and 14. Strip heater 33 is a thin-film heater which may be a Pt/Ti bilayer, W layer, Pt film, Cr film, NiCr film, TaN film deposited on the top surface of EML PIC 10A and can also be any other materials as known in the art for making such a strip or bulk heater.

DFB laser 12 is designed to be operable over a 40° C. temperature range, such as between, for example, about 30° C. to about 70° C. As previously indicated, lasers typically increase in operating wavelength by about 0.16 nm/° C. so that their operational wavelength can be changed within a tunable wavelength range of about 4 nm over this temperature range. In the application here, heater 33 in FIG. 6 is deployed to heat EML PIC 10A, in particular relative to heating laser 12, to its maximum operating temperature. Then, the ambient temperature is monitored, via a monitoring circuit which includes a thermistor for monitoring the temperature of laser 12. If the ambient temperature increases above the maximum operating temperature of laser 12, then the monitoring circuit will decrease a set pre-biased voltage condition of heater 33 which permits a return of the laser operating temperature to its maximum operating temperature or at least within a limited operating temperature range. The maximum operating temperature is also within the window of the desired operating wavelength for DFB laser 12. As a specific example, if the operating temperature range of laser 12 is from about 40° C. to about 70° C. and the desired wavelength operation of laser 12 is approximate to 45° C., then heater 33 would be pre-biased to maintain the ambient temperature of EML PIC 10A from, for example, from about 40° C. to about 50° C. As a result, the maximum temperature deviation that would result would be reduced from about 70° C. to about 20° C. This net change in operating performance would be small. A 20° C. temperature excursion would restrict the DFB laser emission wavelength to about 200 GHz which still meets the requirements of CWDM channel spacing while still maintaining a long reach optical signal quality.

From the foregoing, it can be seen that the deployment of heater 33, in lieu of a laser bonded TEC, to perform the minimum temperature excursion relative to the desired application temperature while maintaining any temperature excursion within the allowed wavelength band for a WDM signal on the ITU wavelength grid, heater 33 functionally replaces the TEC or other such cooler, which is a comparatively expensive PIC component, provides for a larger footprint, and requires a hermetically sealed package, all which increase the costs of an integrated PIC such as an optical transmitter, which costs are not generally required in the case of coolerless EML PIC 10 and 10A of this invention. Thus, heater 33 permits the temperature control of laser 12 in a coolerless environment without a substantial need for a hermetically sealed package for EML PIC 10A while preserving the required operating laser temperature within the permissible wavelength band tolerances for channel signals. As not previously recognized in the art for a DFB laser or an EML PIC, the use of an integrated heater 33 eliminates the need of a TEC while preserving required laser acceptable temperature and wavelength operating conditions and performance over a high temperature operating range.

In addition to the foregoing temperature tuning, fine tuning with other approaches may additionally be included to wavelength tune laser source 12, other than or in addition to heating and cooling. For example, employing current tuning via changes to the laser drive current or through phase tuning such as in the case where laser source 12 is a DBR laser and has a phase tuning section.

A further embodiment of a coolerless EML PIC is shown at 10B in FIG. 7 which, in addition, comprises a variable gain/loss element 35, which functions as a SOA/VOA, and is integrated in the EML optical path after EAM 14. In the case of fine tuning the laser wavelength via drive current changes to laser 12, this will also change its output power so that with such current changes having an accompanying decrease in power, gain/loss element 35 is operated with a positive bias, functioning as a SOA, to increase the power output to a desire maintained power level through via the applied positive bias of element 35. This is particularly important in an uncooled EML PIC because with increasing temperature, the power output correspondingly decreases. Also, with increasing operational temperature of the EML PIC in a coolerless ambient, the current of the laser source may be also decreased to maintain the operating characteristics. The resulting decrease in current is a decrease in output power so that the gain/loss element 35 may be operated to increase the signal power to an acceptable level. By the same token, if such current changes with an accompanying increase in power or is operated at a high optimum power to maximize certain laser operating characteristics, gain/loss element 35 is operated with a negative bias, functioning as a VOA, to decrease the output power of EML PIC 10B to a desired maintained power level through power absorption via the applied negative bias of element 35.

Typically, as the temperature of EML PIC 10B, or any previous embodiment for that matter, increases, the laser-modulator detuning decreases. Although the Q of EAM 14 is improved or maintained constant because of this, the power output of EML PIC 10B would decrease or become degraded. The deployment of an integrated power controlling element 35 provides for design freedom to insure constant output power at elevated temperatures while maintaining the Q performance of the EML PIC over the permitted temperature operating range. In this connection, the embodiments of FIGS. 6 and 7 may be combined to control the operating characters of the laser source 12 and the EAM 14 over a high temperature operating range employing both strip heater 33 and element 35. In this regard, it should be realized that strip heater 33 may be divided into two separate parts 33A and 33B, one for laser source 12 and the other EAM, in order to temperature control these two electro-optic elements independently of one another, as will be explained in greater detail later on in connection with transmitter photonic integrated circuits or TxPICs to which the forgoing principals of coolerless operation may also be applied.

The foregoing embodiments have dealt with approaches to operation of a coolerless EML PICs. The principles for coolerless operation are also applicable to an array of coolerless multi-channel PICs comprising a monolithic InP-based chip such as the type illustrated in FIG. 8. FIG. 8 discloses a transmitter photonic integrated circuit or TxPIC chip 50 which is an In-based chip, the structural details of which are disclosed in incorporated U.S. patent application Ser. Nos. 10/267,330 and 10/267,331, supra. In the case here, however, TxPIC chip 50 is operated in a coolerless mode, which is it is operated without the use of any cooler, such as a TEC. As shown in FIG. 8, coolerless, monolithic PIC chip 50 comprises groups of integrated and optically coupled active and passive components including an integrated array of laser sources 52, such as DFB semiconductor lasers or DBR semiconductor lasers. Each laser source 52 operates at a different wavelength, $\lambda_1$-$\lambda_N$, from one another, where the group of wavelengths provides a wavelength grid approximating a standardized wavelength grid, such as the ITU wavelength grid. Such a wavelength grid is illustrated in FIG. 28. As shown in FIG. 28, the laser source wavelength grid is provided to have, as best as possible, a uniform or periodic channel wavelength pitch or an array spectral spacing, $\Delta\lambda$, as well as a uniform channel width. However, in one important feature of this invention, to be explained in more detail later, chip 50 may be permitted to float within a predetermined temperature range while the grid or channel spacing remains constant or fixed. In other words, on one hand, the wavelength grid is permitted to change in wavelength with changes in temperature, which means that the individual wavelengths of the laser sources are also changing with temperature but, on the other hand, the array spectral spacing is set to remain the same, such as, for example, in the case of a uniform spacing, set to 25 GHz, 50 GHz, 100 GHz or 200 GHz. The gird spacing can also be provided with nonuniform spacing which remains fixed.

At the rear extent of laser sources 52, integrated rear photodetectors 51 may be provided, which are optional. Photodetectors 51 may be, for example, PIN photodiodes or avalanche photodiodes (APDs). Laser sources 52 may be directly modulated or may be operated CW and are provided with an associated external electro-optic modulator 54 as shown in the configuration of FIG. 8. Thus, the CW outputs of laser sources 52 are optically coupled to respective electro-optic modulators 54 forming channel modulated sources. Such light intensity modulators 54 may be electro-absorption modulators (EAMs) or Mach-Zehnder modulators (MZMs) as detailed in patent application Ser. No. 10/267,331, supra, but EAMs are preferred for coolerless operation here in conjunction with DFB laser sources. Modulators 54 each apply an electrical modulated signal to the CW light received from laser sources 52 producing a plurality of optical modulated signals of different wavelengths from the multiple channels for transmission on an optical link in an optical transport or transmission network. The modulated outputs from modulators 54 may be optically coupled to front photodetectors 56. The on-chip deployment of photodetectors 56 is optional.

Alternatively, photodetectors 56 may also be fabricated off-axis of the laser source output by means of an on-chip optical tap to provide a small portion of the modulated output directed from the main optical channel or waveguide path to an offset, integrated photodetector. Front photodetectors 56 may be PIN photodiodes or avalanche photodiodes (APDs). Photodetectors 51 and 56 may also be employed together to monitor the output power or operational wavelength from the respective laser sources 52. Alternatively or in addition, photodetectors 56 may also function as variable optical attenuators (VOAs) under negative bias in order to selectively adjust modulated source output power to equalize the optical output power across the entire array of laser sources 52 thereby providing on-chip integrated pre-emphasis. Further, alternatively or in addition, photodetectors 56 may be employed as on-chip semiconductor optical amplifiers (SOAs) under positive bias. These devices can, therefore, perform a VOA/SOA function to provide for power level compensation in the manner discussed in connection with the PIC embodiment of FIG. 7. Also, as a further embodiment, a different frequency tone may be applied to each front photodetector 56 to provide for laser source tagging or identification as described and taught in U.S. patent application Ser. No. 10/267,330, supra.

As indicated above, and as explained in more detail in patent application Ser. No. 10/267,331, supra, the modulated optical signal outputs of modulators 54, via front photodetectors 56, are respectively coupled to an on-chip wavelength selective combiner or filter, shown here as an arrayed waveguide grating or AWG 60 via optical input waveguides 58, numbering the number of signal channels of modulated sources. It is within the scope of this invention to include other wavelength-selective combiners or decombiners, as the case may be for intended uses, such as, for example, Echelle gratings, cascaded Mach-Zehnder interferometers (MZIs), broadband multiplexers of the type shown, for example, in U.S. Pat. No. 6,580,844 (which is incorporated herein by its reference), or so-called free-space diffraction gratings (FS-DGs). Such wavelength-selective combiners or multiplexers are more conducive to higher channel signal counts on TxPIC chips 50. However, it is within the scope of this invention to practice the invention in connection with non-wavelength selective type of optical combiners, such as power couplers, star couplers, MMI couplers or optical couplers with a multimodal coupled region comprising a plurality of waveguides as disclosed and taught in U.S. published patent application, Publication No. 2003/0012510, which application is incorporated in its entirety herein by its reference or a multimodal coupled region that is, in part, multiple waveguides and, in part, free-space as disclosed in U.S. Pat. No. 7,745,618, which patent is incorporated herein by its reference.

Each of the modulated sources or, for example, semiconductor modulator/laser (SML) signal channels, or more particularly EML signal channels, is representative of an optical signal channel on TxPIC chip 5, which, for example, may have as many as forty signal channels or more. In FIG. 8, there is a plurality of N equal 10 channels on TxPIC chip 50. There may be less than 10 channels or more than 10 channels formed on chip 50. In FIG. 8, the output of each signal channel from a respective, integrated EML signal channel is coupled to a respective waveguide 58(1) to 58(10) to the zero order Brillouin zone input of AWG 60.

It is within the scope of this invention that photodetectors 56 function as VOAs or SOAs for the purpose of pre-emphasis across the modulated source array, which pre-emphasis is different when operating in the higher temperature range. It is different to the extent that the PIC elements may have wider sensitivity (relative to gain or loss) at higher operating temperatures so that wider dynamic range for setting channel power may be necessary. Also, as well understood in previously incorporated patent applications herein, that photodetectors 51 and 56, laser sources 52 and modulators 54 are electrically isolated from one another.

Also, it should be noted that the output capability of each laser source (DFB or DBR) is a sensitive function of the designed laser source grating that sets its emission wavelength from the peak of the active region wavelength. Performance gains over temperature can be obtained by designing the laser source grating with respect to gain peak such that alignment between the two improves at higher temperature so that a coolerless TxPIC 50 can be made more of a reality with such a gain advantage. Particularly, laser sources with relatively larger detuned wavelengths can take good effect of this advantage although there can be, in some instances, a rise in the laser source threshold current. Also, the high temperature operation of the TxPIC laser sources does not affect their single mode properties as seen from their side mode suppression ration (SMSR) even at about 70° C., being close to 40 dB. The total tuning rate of DFB lasers as on-chip laser sources 52 is about 0.16 nm/° C. or −20 GHz/° C. On the other hand, the tuning rate of an AWG as an on-chip combiner is about −16.25 GHz/° C. If the DFB laser bias remains unchanged, then it's natural tuning rate is lower than 20 GHz/° C. and will be closer to the AWG tuning rate. In any case, the differential tuning between a DFB laser at constant power and an AWG is about 3.75 GHz/° C., which is fairly small so that the co-thermal tracking and control can be easily realized, which is a basic objective of this invention, to maintain a substantial grid alignment between the laser source wavelength grid with the optical combiner passband over the entire high temperature operating range. Also, the insertion loss of an AWG over the higher temperature operating range is fairly constant. However, changes in local operating temperatures of the laser sources with the combiner may have a detrimental effect on associated modulators in signal channels between these two on-chip elements (between a laser source and AWG or combiner). As the ambient temperature of the TxPIC increases, the wavelength detuning of a laser source relative to PL peak of the active region wavelength is reduced so that the band-edge of the active region red shifts faster than the laser source operating wavelength. This leads to an increase in the on-state loss of a channel EAM, or its overall insertion loss, as the absorption edge moves closer to the laser source signal or operating wavelength. Such insertion losses are preferably not tolerated because the optical signal reach in an optical fiber of the TxPIC transmitter is substantially affected. Thus, it becomes necessary in such a changing temperature environment to adjust the effective chirp parameter of the EAM so that the modulator is heated to move the EAM absorption edge further away from the laser source operating wavelength. In this case, it should be noted that the heater for the laser and the modulators need to be separate heaters. Also, in order to minimize the complexity of optimizing the performance of the EAMs under changing temperature conditions, it is preferred that the modulator swing voltage is kept constant and the modulator bias voltage be varied with changes in temperature of the modulator.

As already indicated earlier, each signal channel is typically assigned a minimum channel spacing or bandwidth to avoid crosstalk with other optical channels. For example, 50 GHz, 100 GHz or 200 GHz are common channel spacings between signal channels. The physical channel spacing or center-to-center spacing 68 of the signal channels may be 100 µm, 200 µm, or 250 µm to minimize electrical or thermal cross-talk at higher data rates, for example, of 10 Gbit per second or greater, and facilitate routing of interconnections between bondpads of multiple PIC optical components or elements formed on the chip. Although not shown for the sake of simplicity, bonding pads may be provided in the interior of PIC chip 50 to accommodate wire bonding to particular on-chip electro-optic components in addition to chip-edge bonding pad groups 55.

Referring again to combiner 60 comprising an AWG, the respective modulated outputs from electro-optic modulators 52 are coupled into optical waveguides 58(1) to 58(10) to the input of AWG 60 as shown in FIG. 8. AWG 60 comprises an input free space region 59 coupled to a plurality of diffraction grating waveguides or arms 61 which are coupled to an output free space region 62. The multiplexed optical signal output from AWG 60 is provided to a plurality of output waveguides 63 which comprise output verniers along the zero order Brillouin zone at output face 62A of free space region 62. Output waveguides 63 extend to output facet 69 of TxPIC chip 60 where a selected vernier output 63 may be optically coupled to an output fiber (not shown). The deployment of multiple vernier outputs 63 provides a means by which the best or optimum output from AWG 60 can be selected having the best match of the wavelength grid passband of AWG 60 within a range of different operating high temperatures with the established wavelength grid of the laser sources. Seven vernier outputs 63 are shown in FIG. 8. It should be realized that any number of such vernier outputs may be utilized. Also, the number of such vernier outputs may be an odd or even number.

In operation, AWG 60 receives N optical channel signals, $\lambda_1$-$\lambda_N$, from coupled input waveguides 58 which propagate through input free space region 69 where the wavelengths are distributed into the diffraction grating arms or waveguides 61. The diffraction grating waveguides 61 are plurality of grating arms of different lengths, by ΔL, from adjacent waveguides, so that a predetermined phase difference is established in waveguides 61 according to the wavelengths $\lambda_1$-$\lambda_N$. Due to the predetermined phase difference among the wavelengths in grating arms 61, the focusing position of each of the signals in grating arms 61 in output free space region 62 are substantially the same so that the respective signal wavelengths, $\lambda_1$-$\lambda_N$, are focused predominately at the center portion or the zero order Brillouin zone of output face 62A. Verniers 63 receive various passband representations of the multiplexed signal output from AWG 60. Higher order Brillouin zones along output face 62A receive repeated passband representations of the multiplexed signal output but at lower intensities. The focus of the grating arm outputs to the zero order Brillouin zone may not be uniform along face 62A comprising this zero order due to inaccuracies inherent in fabrication techniques employed in the manufacture of chip 50. However, with multiple output verniers, an output vernier can be selected having the best or optimum combined signal output in terms of power and strength.

PIC chip 50 with its integrated array of N modulated sources can be operated coolerless as taught in earlier embodiments with regard to EML PICS. The active region of chip 50 may comprise AQ to provide for a wider, substantially stable temperature window across the modulated source array comprising signal channels 1 to 10 as illustrated in the FIG. 4 for a single EML PIC. With the deployment of an AQ active region, there is little change in output power of the laser source array across the chip over a wide temperature range of operation, such as from about 40° C. to about 70° C. with proper detuning. Also, in combination with the utilization of an AQ active region across the chip, laser source 12 is positively detuned, i.e., the grating pitch of the feedback grating of the respective DFB lasers 52 are chosen such that the laser operates on the longer wavelength side of the gain peak. This detuning provides for laser performance to be substantially uniform over a wider wide temperature range, in particular, the laser gain is maintained or actually increases some with increasing operating or ambient temperature as previously discussed. Laser sources 52 may be fabricated to operate at a respective positive detuned wavelength, for example, in the range of about 25 nm to about 40 nm from the gain peak. The laser detuned transmission wavelength is close to the absorption edge of the modulator AQ active waveguide core insuring optimal wavelength compatibility between laser sources 52 and corresponding EAMs 54 without significantly degrading the performance of the laser sources due to the applied positive detuning.

In addition, chip 50 may include strip heaters 53A formed adjacent to or in close proximity to each laser source 52 as shown in FIG. 8. These heater are employed to fine tune the operating wavelengths and, therefore, the result wavelength spacing, between adjacent laser sources in the array. Strip heaters 53B may also be employed adjacent to or in proximity to EAMs 54. In the case of MZMs on chip 50, a heater 53B would be placed along a portion of each arm of the Mach-Zehnder interferometer. Also, as shown in FIG. 29, the EAM structure 15, which may be part of a modulated source in each of the signal channels in FIG. 8, includes on top a dielectric layer 35, which may be, for example, $Si_3N_4$, over which is longitudinally formed, along the modulator length, a heater strip 37. Heater 37 may be comprised of a Pt/Ti bilayer, W layer, Pt film, Cr film, NiCr film, TaN film deposited on the top surface of dielectric 35. Having the heater 37 on top of each EAM 15 or 54 is the most efficient for transfer of heat because the heater is only approximately 1 μm away from the active region 26 of the modulator. This is more efficient than the heater positions suggested, for example, in U.S. Pat. No. 6,665,105, which are not as effective and are difficult to manufacture. Heaters 37 or 53B are employed to optimize the operation of modulators 15 and 54 due to wavelength changes made to the wavelength grid of the laser array. Operating characteristics of EAMs can become offset from an optimized condition due to thermal changes, and therefore, wavelength, of its corresponding laser source 12 or 52. Thus, the temperature of the modulators should be monitored since the EAM bandgap offset from the detuned emission wavelength of the laser sources can change with operating temperature changes to the laser sources. The monitored temperature is used to vary the modulator DC bias voltage with temperature. Also, the DC bias voltage of the modulators will have to be adjusted relative to changes in modulator absorption due to temperature changes to achieve optimum modulator performance. Thus, heaters 53B may be utilized to independently adjust the EAMs to optimize there absorption and bandedge as well as modulator chirp or adjustment of their absorption with applied bias to optimize their extinction ratio (ER). Further, a heater 60A may be provided for combiner 60 as indicated in FIG. 8. Since the tuning or slew rate between DFB lasers sources 52 and combiner 60 are approximate, the wavelength grid can be concurrently tuned to maintain a approximate grid relationship with one other. This heater 60A may, for example, be a serpentine metal strip formed over the combiner area of the chip. The heater serpentine strip may be comprised of a Pt/Ti bilayer, W layer, Pt film, Cr film, NiCr film, TaN film deposited on the top surface of a dielectric, such as $Si_3N_4$, formed over the area of combiner 60. Also, it is with the scope of this invention to use a heater across the grating arms 61 of AWG multiplexer 60 to control the center wavelength of AWG 60 to maintain a substantial grid match to wavelength grid of laser sources 52. An example of the foregoing heated grating arms is seen in U.S. Pat. No. 5,617,234, which patent is incorporated herein by its reference.

It is also within the scope of the embodiment of FIG. 8 to include power changing elements (PCEs) in each channel between EAM 54 and front PD 56. Such a PCE may be a SOA, VOA or a combination SOA/VOA. The PCE may also have an accompanying heater to move the gain peak or to move the gain peak in tandem with laser source gain peak.

As indicated previously, the heaters 37 and 53B are employed in the control of the modulated sources can be accomplished without the requirement of a TEC or Peltier cooler when changes in temperature are made by heaters 53A and 60A to maintain channel spacing of signal channels required for coolerless operation of TxPIC chip 50, thereby eliminating the expensive cooler component. The use of these heaters 50 and 60A to stabilize the operating temperature of the laser sources 52 within an acceptable temperature range, rather than using a TEC, reduces packaging costs significantly as well providing for a smaller footprint and reducing if not eliminating the requirement for a hermetically sealed chip package, resulting in a coolerless TxPIC transmission chip.

Reference is now made to FIG. 9 which shows the typical layout for an RxPIC 40. It should be noted that RxPIC chip 40 is just one embodiment of many that may be employed in a digital optical transmission network. See, for example, the different embodiments illustrated in U.S. patent application Ser. No. 10/267,304, which is incorporated herein by its reference. A particular example is the provision of an integrated optical amplifier (OA) 42 on RxPIC chip 40, such as a semiconductor optical amplifier (SOA) or a gain-clamped semiconductor optical amplifier (GC-SOA). RxPIC 40 is an InP-based semiconductor chip that has an input at 41 to receive a multiplex optical signal from an optically coupled fiber link. Optical amplifier 42 may be integrated in the circuit to boost the gain of the multiplexed signal prior to demultiplexing. Such amplification can alternatively be done off-chip with an optical fiber amplifier positioned before the input of the WDM signal into on-chip waveguide 41. The multiplexed signal is received in chip waveguide 43 and provided as an input to decombiner 44 which may, for example, be an AWG. The multiplexed signal is provided to input slab or free space region 46A of AWG 44. AWG 44 comprises input slab 46A, an array of grating arms 44A of different lengths and an output slab 46B as known in the art. Output slab 46B has a plurality of outputs in the first order Brillouin zone, one for each demultiplexed channel wavelength signal, which are respectively provided to PIN photodiodes 49(1) . . . 49(12). Again, although there are twelve channels shown here for chip 40, there may be as many as 40 or more such channel signal outputs from AWG 44 with corresponding photodetectors 49. A higher Brillouin order output channel at 47A may also be provided on RxPIC chip 40 to provide a channel light output to PIN photodiode 48 in order to monitor the wavelength, power of the signals or provide for FEC decoding. Also, to be noted relative to the present invention, decombiner 44 also has a local heater 45, which is similar to heater 60A in FIG. 8. This heater 45 may, for example, be a serpentine metal strip formed over the decombiner area of the chip. The heater serpentine strip may be comprised of a Pt/Ti bilayer, W layer, Pt film, Cr film, NiCr film, TaN film deposited on the top surface of a dielectric, such as $Si_3N_4$, formed over the area of decombiner 44.

Reference is now made to FIG. 10 illustrating an embodiment for carrying out this invention employing the foregoing coolerless TxPIC and RxPIC chips 40 and 50 in a floating grid, optical transmission WDM network operating under the conditions that the comb of operating wavelength grid of the modulated sources "floats", meaning that the operating modulated source wavelengths are permitted to drift with variations in ambient temperature within a given temperature range or the modulated sources can be heated to a maximum temperature within a high temperature operating range for the PIC but the given or predetermined wavelength or array spectral spacing between adjacent modulated sources in the laser source array is maintained at a fixed value, i.e., the comb of wavelengths of an TxPIC laser array are locked to a fixed frequency spacing where the array spectral spacing between any two laser sources in the TxPIC may be uniform (all the same bandwidth) or nonuniform (different bandwidths including one or more different from all the others in the grid or monotonically increasing or decreasing in bandwidth between adjacent laser sources across the grid). The floating wavelength grid, made up of N signal channels, can change in wavelength up or down within a given wavelength bandwidth according to a predetermined operational high temperature range as the ambient temperature of the PIC changes but the laser source array wavelength spectral spacing between the signal channels remains fixed. The TxPIC chip is allowed to operate in a higher temperature environment, such as, for example, between room temperature and 70° C. or more, such as possibly as high as 85° C.

This floating wavelength grid approach is contra to SONET/SDH standards where the signal channels are maintained along a standardized ITU wavelength grid. However, certain advantages are achieved through the deployment of this floating grid approach. First and foremost, the adaptation of multiple signal channels on a single PIC chip lends itself to better temperature control of active and passive components or elements on the chip rather than attempts at stabilizing the chip ambient via a TEC cooler. Second, a temperature stabilization system for a PIC chip is extensive including a costly chip cooler and it would be less expensive and easier to operate a PIC chip in a high temperature environment including high temperature hazardous environments for military deployment. Third, the TxPIC package does not generally need to be a hermetically sealed package.

The floating grid optical transmission network shown in FIG. 10 comprises TxPIC chip 100 optically linked in an optical point-to-point transmission system via optical link 119 to RxPIC chip 120. TxPIC 100 comprises a plurality of integrated components in plural paths of N signal channels, identified by $\lambda_1$ to $\lambda_N$, to AWG multiplexer 110 where each such path includes a laser source 102, shown here as a DFB laser, an electro-optical modulator 106 and a SOA or VOA 108 coupled to a first order input of AWG 110. Each laser source 102 is operated cw at a peak wavelength different from other sources. The output of each laser source 102 is modulated with an information signal at its respective modulator 106(1) . . . (N). Modulators 106 may be, for example, a semiconductor electroabsorption (EA) modulator or a Mach-Zehnder (MZ) modulator as previously explained. The modulated signal may then be provided with additional gain or attenuation via SOA or VOA shown as power changing element (PCE) 108. SOAs and/or VOAs 108 are optional. Alternatively, PCEs 108 may be forward photodetectors (FPDs) for monitoring power and/or wavelength as well as operating as a PCE, such as a VOA. The outputs from elements 108 are provided as inputs to AWG multiplexer 110. The combined WDM output of AWG multiplexer 110 is optically coupled off-chip to optical link 119.

In order to operate TxPIC chip 100 in a coolerless mode, each DFB source 102 is provided with a corresponding integrated heater 102A and each modulator 106 is optionally provided with a corresponding heater 106A. Also, AWG 110 is optionally provided with a heater 110A. The DFB heaters 102A are for fine tuning of the laser wavelength to maintain proper wavelength grid channels spacing relative to adjacent signal channels. The modulator heaters 106A are to maintain the absorption characteristics of the modulators with optimum extinction ratio and bias, as the operating characteristics of the laser sources 102, detuned from the gain peak of the active region wavelength, will also be affected with changes in temperature, which also affects the performance of the modulators. The third heater 110A for AWG 110 maintains the alignment of the AWG wavelength comb or grid with the wavelength comb or grid of laser sources 102. The heater 110A may be a serpentine strip heater over the AWG 110 and separated therefrom by a dielectric layer. It is also within the scope of this invention for heater 110A to be formed adjacent to AWG 110.

A small sample of the multiplexed channel signal output from AWG 110 is provided through an optical tap at the multiplexed signal output from AWG 110 to photodiode (PD) 112 which provides a photocurrent input to programmable logic controller (PLC) 116. PLC 116 discriminates among the different channel signals, $\lambda_1 \ldots \lambda_N$, to determine if the operating wavelengths of DFB sources are at their desired emission wavelengths for proper frequency or spectral spacing as detuned from the peak active region wavelength. This discrimination process can be carried out by employing dithering signals on the modulated channel signals for each modulated source on TxPIC 100, providing each such signal with an identification tag. As a result, each of the channel signals can be separated and analyzed as to its wavelength to determine if it is operating at a desired, fixed channel spectral spacing, as seen in FIG. 28, relative to adjacent signal channels as well as optionally operating sufficiently close to its desired peak channel wavelength within a channel bandwidth. If the channel spacing of any particular laser source 102 is off from a desired and fixed channel spacing relative to an adjacent signal channel, its operating wavelength can be changed to the desired grid wavelength spacing by a signal provided from PLC 116 to heater control circuits (HCCs) 120A and 120B which provides a temperature control signal to a corresponding laser source heater 104A for fine tuning, such as a few nanometers or tenths of nanometers, by increasing or decreasing the operating temperature of its corresponding laser source 102 by an amount necessary to increase or decrease its operating wavelength bandwidth to be substantially at the desired channel spectral spacing. Although the current of laser sources 102(1)...102(N) may be adjusted for power control, this not as desirable because of the accompanying wavelength tuning that occurs. The preferred approach is to bias laser sources 102 at the highest possible current level, within the limits of reliability and desired operating wavelength, and employ an on-chip VOA, or a front photodetector functioning as a VOA or other PCE at 108, to compensate for power loss as a result of misalignment between the laser source wavelength comb or grid with the combiner wavelength grid or passband or due to power degradation of laser sources 102 with temperature or due to aging. In such a preferred approach, the above mentioned fine tuning of laser sources 102 via their heaters 102A is a valuable asset in TxPIC high performance operation. In this manner, heaters 102A can also be deployed to tune the operating wavelength of laser sources 102(1)...102(N) to keep the laser source array operating as a floating channel grid with fixed channel spacing. Thus, heaters 102A provide an ability to perform fine wavelength tuning over a given temperature range. The same is true relative to heaters 53A and 53B in the embodiment of FIG. 8.

It should be noted that the tuning rate via heaters 53A and 102A is fairly constant, about 1 GHz/mW between about 20° C. and about 70° C. and possibly as high as 85° C. This wavelength tuning is also linear with respect to heater power dissipation. In order to lock the laser wavelength grid to a desired floating grid spectral spacing, the emission wavelength of the respective laser sources must be known within this given temperature range. As a specific example, if the tuning rates of DFB lasers in an array are about −20 GHz/° C., then for a TxPIC with a channel spectral spacing of 200 GHz translates into a temperature range of about 10° C. With the knowledge of the tuning rate of the laser sources, a coarse tuning of the laser sources can be achieved from controlling the temperature of the TxPIC chip 100 employing a thermistor (not shown) on the carrier for the TxPIC chip as described in the previously mentioned and incorporated patent application Ser. No. 10/267,330, supra. Using a lookup table in controller (PLC) 116, for example, the temperature of the laser sources can be inferred from the changing resistance value of the thermistor.

As previously indicated, photocurrent from RPDs 101 may be independently employed to measure the laser source output power. A small part of the TxPIC output from TxPIC 100 is tapped of and provided to Fabry-Perot wavelength locker (FPWL) operating with an etalon to provide both an indication of the average output power of TxPIC 100 as well as an indication of the average power and wavelength of the individual signal channels employing a different low frequency tone on each of the channel signals in the manner as explained and set forth in the previously mentioned and incorporated patent application Ser. No. 10/267,330, supra. Controller 116 then provides the following feedback correction signals to adjust the following parameters: (1) Adjust laser source bias current to the highest reliable output power level for the laser sources. This will also change the operating wavelength of the respective laser sources. (2) Adjust the laser heater current for fine tuning, i.e., to adjust for laser source wavelength drift over time and for wavelength changes with changes in the laser source bias current and temperature. (3) Adjust FPD (VOA) 108 bias level for TxPIC pre-emphasis, i.e., output power flattening across the N signal channels across TxPIC chip 100.

In another embodiment of this invention, the use of a thermistor can be replaced by the employment of the integrated rear photodetectors (RPDs) 101(1)...101(N) and the integrated front photodetectors (FPDs) at positions indicated at (108(1)...108(N). The ratio of the FPD 108 to RPD 101 is a good indicator of TxPIC temperature. FPDs (VOA) 108 which have modulators 106 between it and laser source 102, the photocurrent from the FPDs 108, compared with that from RPDs 101, is affected more by TxPIC temperature. FIG. 30 is a graphic, semi-log illustration of the ratio of FPD 108 to RPD 101 for the average ratio between channels 1 and 10 on an N=10 TxPIC 100. The ratio of the photocurrents is approximately exponential with temperature for all channels. In this connection, reference is made to graphic, semi-log linear illustration of FIG. 31 which shows the relationship between laser source emission wavelength for a 10 channel TxPIC 100 over a wide temperature range with respect to the ratio of photocurrents from their respective FPDs 108 and RPDs 101. Except at the limits of temperature range control, the emission wavelengths of the laser sources are substantially linear with the FPD/RPD photocurrent ratio. This information can then, inter alia, be employed for fine tuning of laser sources 102. One of the advantages of using the FPD/RPD photocurrent ratios for controlling laser source wavelength is that these devices have a large dynamic range for purpose of implementing the control. The sensitivity can be further improved by making the integrated, fabricated lengths of FPDs 108 different from the integrated, fabricated lengths of RPDs 101.

Optionally, the temperature of AWG 110 at TxPIC 100 may be monitored with a thermistor 113 which provides PLC 116 with current information of the AWG ambient temperature via input 115. PLC 116 can then provide a control signal to heater control circuit (HCC) 118 to provide a temperature control signal to heater 110A to increase or decrease the ambient temperature of AWG 110. In this manner, the wavelength passband grid of AWG 110 may be shifted and adjusted to optimize the wavelength grid or passband of AWG 110 with the floating wavelength comb of N laser sources 102.

Also, the input side of AWG 110 includes a port 117 relative to a higher order Brillouin zone of the input side of AWG 110 for the purpose of receiving a service signal, $\lambda_s$, from RxPIC 120 via optical link 119, which is explained in further detail below. This service signal is demultiplexed by AWG 110 and provided on port 117 as an output signal and thence converted to the electrical domain by integrated, on-chip PD 114. The electrical signal from PD 114 is taken off-chip and provided as an input 119 to PLC 116.

At RxPIC chip 120, AWG demultiplexer 123 includes higher order Brillouin zone outputs 125A and 125B to receive respective channel signals, such as, for example, $\lambda_1$ and $\lambda_2$ or any other such signal pairs, in order to determine the position of the floating wavelength grid or comb received from TxPIC 100 via link 119 within a determined range of wavelengths determined by a temperature range over which the wavelength grid is permitted to float. Also, using these two channel signals as a wavelength grid sample, a determination can be made as to whether the AWG wavelength is shifted and, if so, by how much. Photodetectors 125A and 125B provide an electrical response to optical signals on output lines 126A and 126B to programmable logic controller (PLC) 127. These PDs 125A and 125B are sensitive to the peak optical responses of the total grid output and can be deployed in the electrical domain to determine the spectral location of the floating wavelength grid in order to lock onto the grid and then demultiplex the lock grid of channel signals and convert them into electrical signals via the integrated photodetectors 126(1) . . . 126(N) on chip 120. Also, if the delta shift, δ, of the signal grid is detected as either a red shift or a blue shift, a delta shift value can be provided back TxPIC 110 via a service channel, $\lambda_{OSC}$, for purposes of aligning subsequent transmitted channel signal grids from the transmitter chip 110 more in thermal alignment with immediately received channel signal grids at the receiver chip 120. Receiver PLC 127 can first make adjustment to the receiver AWG wavelength grid, via heater control circuit (HCC) 130 via line 132 to AWG heater 123A, to either increase or decrease the ambient operating temperature of AWG 30 and to shift its wavelength grid either to the longer or shorter center wavelength to match the floating grid of incoming channel signals based on the determined delta shift, δ, of the WDM signal floating grid. If this grid adjustment is not sufficient, then data relating to channel signals floating gird may be forwarded as a service channel signal, $\lambda_s$, for thermal adjustment at the transmitter end of the floating wavelength grid. In these circumstances, PLC 127 can forward such grid correction data as a service channel signal, $\lambda_s$, via an electrical correction data signal on output line 128 to service signal channel modulator 129, which may be comprised of an on-chip, combination integrated laser source and an electro-optic modulator, to provide this signal through AWG 123 and counter propagation via optical link 119 service channel to TxPIC chip 100 at the transmitter end of the network. This service channel signal, $\lambda_s$, is then demultiplexed via AWG 110 and provided on higher Brillouin order output 117 to PD 114. The electrically converted service signal data is deciphered by PLC 116 which makes a correction to the thermal ambient of a laser sources 102 via HCC 120A along with correction to the thermal ambient of AWG 110 via HCC 118, if necessary. As will be seen below, the thermal ambient of laser sources 102 and AWG 110 are maintained to be substantially the same since the rate of change in thermal properties, and as a result a change in wavelength grid match-up, approximate one another. This process may optionally also involve changing of the current level of sources 102 as well as the bias level and extension ratio of the corresponding modulators 106A by changing the bias level changes from PLC 116 as well as changing their operational temperature via heaters 106A. Also, front photodetectors (FPDs) at 108(1) . . . 108(N) may be operated as a power changing element to provide on-chip pre-emphasis due to changes in operating current levels of laser sources 102 in adjust of the floating wavelength comb or grid formed by these laser sources.

FIG. 11 illustrates a further embodiment for carrying out this invention comprising floating grid network 140. Network 140 includes on the transmitter end at least one TxPIC 142 and at least one RxPIC 144 which are coupled to optical transmission link 146. TxPIC 142 includes a plurality of N signal channels of laser sources LD(1) . . . LD(N), modulators M(1) . . . M(N) and photodetectors PD(1) . . . PD(N). Alternatively, as discussed in the embodiment of FIG. 10, the photodetectors may alternatively be power changing elements (PCEs). The signal outputs of N channels are coupled as inputs to combiner 148, which is shown here as a wavelength selective combiner, which combiner provides a combined WDM signal onto link 146. As in the embodiment of FIG. 10, TxPIC 142 includes a feedback at tap 149 comprising a portion of the WDM output signal which is provided to programmable logic controller (PLC) 150. At PLC 150, the optical feedback signal from tap 149 is converted into electrical signals used in wavelength identification in a manner known to those skilled in the art. PLC 150 also has electrical signal outputs to heaters 141 for N laser sources, electrical signal outputs to heaters 143 for N modulators and an electrical signal output to heater 145 for combiner 148.

On the receiver end, a WDM signal is received from link 146 by RxPIC 144 via an optical amplifier 155 at the PIC input. RxPIC 144 comprises decombiner 147m shown here as a wavelength selective decombiner, which has H optical signal outputs, one each to a respective on-chip photodetector (PD) 151 for OE conversion of the demultiplexed signals. The converted signals are amplified at transimpedance amplifier/automatic gain control circuits 152 and, thereafter, clock and data recovery is performed at CDR circuit 154 as known in the art. Also, all of the N signals from circuits 152 are summed at summer circuit 156 and the summed value is provided to receiver programmable logic controller 158. As can be seen in FIG. 11, an output of PLC 158 is provided to control the temperature of heater 153 of decombiner 153.

As shown at the top of FIG. 11, TxPIC 142 provides a floating wavelength grid of combined signals 157 having a grid center wavelength, for example, at a given temperature, $T_1$. TxPIC 142 is not provided with any cooling mechanisms but rather is temperature controlled through the application of heater control signals to on-chip heaters 141, 143 and 145. In this connection, the temperature control may extend into a high temperature range, such as between around room temperature to around 70° C. or more and the operation of TxPIC can be set at a maximum operating temperature within this high temperature range. In any case, whether TxPIC 142 is operated without any applied maintenance temperature or with an applied maintenance temperature, any wavelength shift of channel wavelengths due to changes in the ambient temperature, preferably within a given temperature range, which shift is indicated by arrows 157A atop FIG. 11, is permitted but the spectral spacing between adjacent signal channels is maintained at a fixed value as previously explained. However, as a result of temperature floating of the laser source wavelength grid, the floating wavelength grid may be received at RxPIC 144 with a different grid center wavelength that has wavelength-shifted because of a different ambient temperature, $T_2$. Through communication between PLC 150 and 158, as indicated by the dashed line 160, PLC 158 can shift the wavelength filtering comb of decombiner 147 to recognize (detect) the comb of shifted channel wavelengths having a center wavelength at temperature, $T_2$, and lock onto the detected wavelength grid.

In general, the method of operation in the embodiment of FIG. 12 entails the summing of all the decombined signal values at 156 from RxPIC 144 which is received by PLC 158 and used as a means of reference to determine the position, temperature-wise, of the floating wavelength grid within a predetermined bandwidth. For this purpose, the summed value may be employed by controller 158 at the receiver side which includes a lookup table to determine the value of thermal increment required for the receiver decombiner heater 153 to achieve a locked on condition of the incoming floating wavelength grid by means of controlling the temperature of a demultiplexer heater 153 via PLC 158. In other words, controller 158 tunes the receiver decombiner filter grid to match the floating grid so that an intelligent decombining or demultiplexing of the N channel signals in the received WDM signal can be realized.

FIG. 12 illustrates another embodiment for carrying out this invention relative to a floating wavelength grid of a WDM signal received on the receiver side at RxPIC 162. TxPIC 142 on the transmitter side is the same as TxPIC 142 in FIG. 11. However, on the receiver side, RxPIC 162 is different in the manner in which the floating wavelength grid is detected at the receiver. RxPIC 162 includes at least one broadband tunable grid filter 164 which may be, for example, an arrayed grating arm comb filter or other wavelength selective filter. Filter 164 is deployed to lock onto the WDM signal comb 157 received over link 146 by means of employing filter heater 165. Thus, filter 164 may be any grid filter that is capable of being adjusted in some manner to adjust the wavelength comb of the filter 164 to detect and be centered onto the signal comb 157.

After filter 164 is able to lock onto wavelength comb 157, the WDM signal is then decombined at wavelength selective decombiner 166. The decombined outputs are then provided to photodetectors 168 for OE conversion. The incoming signal comb 157 also includes, such as an OSC signal or data in the signal header, a reference signal, $\lambda_R$, that provides an indication to PLC 169 of a reference key to the expected center temperature, $T_1$, of signal comb 157 as well as the fixed wavelength comb spectral spacing between channel signals. Alternatively, this signal can be a starting center wavelength signal, $\lambda_C$, indicative of the center wavelength of signal comb 157 relative to temperature, $T_1$, at TxPIC 142. Based upon one of these information signals, PLC 169 can shift the filter comb of filter 164 via heater 165 and thereafter lock onto the discovered grid which may have a new comb center wavelength, for example, at temperature, $T_2$.

The method of operation of the FIG. 12 embodiment entails, first, communication of the comb spectral spacing of the signal channels from TxPIC 142 and a wavelength reference signal, $\lambda_R$, or a startup center wavelength reference signal, $\lambda_C$, of the grid. Second, the determination of the grid position within a known signal bandwidth at RxPIC 162 based upon the signal, $\lambda_R$ or $\lambda_C$, about the transmitter wavelength comb and locking onto the detected grid or comb of the received WDM signal. Third, adjust of the wavelength grid position of the receiver channel signal decombiner 166 based upon the discovered grid accomplished at filter 164. Fourth, decombine or demultiplex the channel wavelengths via one or more combiners 166 for conversion into electrical domain signals. Fifth, communicate back to TxPIC 142 that the determined grid position has been achieved and, if desired, a reference signal, $\lambda_R$, indicative of the instantaneous locked-on position of the floating wavelength grid at the optical receiver which can be sent to the optical transmitter indicating that a lock on the transmitted floating wavelength grid has been achieved. Rather than sending a wavelength reference signal, $\lambda_R$, in an optical service channel (OSC), the transmitted signal frames may designate a reserved byte or other byte in the frame overhead to contain information relating to the reference or control signal information.

In another approach relative to the embodiment of FIG. 12 is that, at startup of the communication exchange between TxPIC 142 and RxPIC 162 in a corresponding transmitter and receiver, a frequency key, $\lambda_K$, for the floating wavelength grid is transmitted from the optical transmitter to the optical receiver so that the receiver PIC can track the grid by knowledge of the key. As one example, the key on the transmitter side may be a set value based from a lookup table at the transmitter controller correlated to the instantaneous center wavelength of the transmitter floating wavelength grid. Since at startup, there may some transients, in any case, the tracking by a frequency key can be commenced until the optical receiver can lock onto a wavelength grid of an incoming test or correlation signal which is indicative that the temperature tracking between the floating grid at the transmitter and the floating grid identified at the receiver are basically matched. At this point, a handshake can be established by the receiver by sending an acknowledgement to the optical transmitter that a lock-on state has been achieved so that client channel signals can now be transmitted. By tuning the wavelength grid of the optical receiver decombiner through shifting of its wavelength grid according to the frequency key, the grid can be continuously changed to permit proper demultiplexing or decombining of the combined channel signals receiver from the optical transmitter. Then, tracking can be continued on a continuous basis, such as on-the-fly, between the transmitter and the receiver as it would be expected that the movement with time of the floating grid with temperature would move in a slower and more gradual manner rendering such tracking easier. In one example, the tracking at the receiver could be accomplished by an BER feedback system in communication with the transmitter.

As indicated previously and presupposed in FIGS. 11, 12 and 26, the frequency or channel spectral spacing between adjacent laser sources in a wavelength grid form on a TxPIC may be uniform or periodic, i.e., substantially identical across the laser array, or array spectral spacing between adjacent laser sources in a wavelength grid form on a TxPIC may be nonuniform aperiodic, i.e. change (increase or decrease) in spectral width monotonically across the array, or some adjacent laser sources in the array may be one spectral width while others in the array be different spectral width. In either case of a periodic or aperiodic grid, only two detected channel wavelengths form together a key to locate the grid within a given signal wavelength band dependent upon the allowed temperature swing of the coolerless TxPIC. Once the two wavelength keys are simultaneously discovered, the grid can be locked since the other grid wavelengths will be automatically discovered because their fixed relationship with the two frequency keys. The demultiplexer is tuned or can be tuned to demultiplex the auto-discovered grid. In another embodiment, it can be seen that one approach to achieve this auto-discovery is to start the receiver demultiplexer at the permitted low end of the plausible TxPIC temperature range and then incrementally heat the demultiplexer under the control of the optical receiver controller or PLC until there is a simultaneous match to the two frequency keys. Such a function is most useful during startup to initially match the demultiplexer grid to the incoming transmitter WDM channel signal grid. The temperature changes affecting the channel wavelength at the TxPIC at this point should be at a much smaller granularity level. This keying function approach may be the most viable approach since concurrent detection of two spatial channel wavelengths or two reference wavelengths within the channel signal grid will then lock to the entire channel grid since the channel frequency or spectral spacing is fixed.

In another embodiment related to keying, just explained in the previous embodiment employing frequency keying, tone keying can be deployed instead of such frequency keying. Low frequency tones, such as modulated signals in the tens of KHz range, can be employed as signal channel identification tags on signal channels. These low frequency signal channel tags do not interfere with their high modulated frequency signal in the Gigabit range because they are so far afield in frequency domain as to be transparent to one another. Such tone signals can be superimposed on channels, for example, either optionally at the respective laser sources on the TxPIC or at the front photodetectors or at the SOAs or VOAs of each channel, as the case may be. Examples of these kinds of tone channel identification tags are disclosed in the incorporated U.S. patent application Ser. No. 10/267,330. In this embodiment, the transmitter also sends these tones to the receiver as a key for purposes of detection of the channel grid to be transmitted to the receiver. The tone key can be sent in the signal frame overhead at startup or as a OSC signal. The advantage of deploying such a low frequency tone key is that the receiver can easily identify the tones even if they are as much as 40 dB down, meaning that the transmitter floating channel grid has moved quite a bit. A circuit can be deployed at the receiver to discriminate among the different tones using a Fabry-Perot discriminator technique, as known in the art, and based upon the detected tones, move the filter spectrum of the broadband tunable grid filter to detect the grid and the grid bandwidth based upon the tone key. Such filter spectrum shifting can be accomplished by thermal-optic effect, electro-optic effect, or refractive index change effect. Also, a further advantage is that these low frequency tones have a much better sensitivity compared to higher channel frequencies being deployed as a channel frequency key. The tunable filter employed at the receiver to identify the incoming signal channel grid can be tuned to match that grid based upon one, two or more or all the detected tones, tagging signal channels present in the channel grid and then moving the filter spectrum of the broadband tunable grid filter to match the detected grid bandwidth. Since any fixed periodic or aperiodic channel spacing will be the fixed across the channel grid, tone keying to the channel grid using at least one channel tone key can be achieved.

It should be recognized and understood relative to the embodiments of FIGS. 10-12 that there are two approaches in the deployment of a floating wavelength grid operation in an optical transmission network at the transmitter. In the first approach, the signal wavelengths are thermally floating because of the lack of temperature control at the PIC, i.e., the signals wavelengths may freely shift with temperature changes at the TxPIC while maintaining the spectral spacing between adjacent signal wavelengths as fixed value. In this case, the ambient temperatures of the active elements on the TxPIC may be temperature adjusted in order that wavelength comb 157 of the transmitted WDM signal can be more easily detected at the receiver side. This temperature adjustment may be accomplished with feedback from the receiver to the transmitter to enhance the rate of achieving grid detection by the receiver of the thermally floating signal comb 157. In the second approach, the wavelength comb 157 at the transmitter may be set at a maximum temperature, $T_1$, for example, within the designed temperature operating range of the TxPIC via operation of the active element heaters on the TxPIC. After the temperature $T_1$ is reached, the operating parameters of the laser sources, modulators and PCEs or PDs may be set to be optimized at this temperature. Such parameters are current bias, chirp, modulation extinction ratio and voltage swing limits. Any shift or drifting of wavelength comb 157 can be continuously adjusted by the TxPIC PLC. In this manner, the receiver can quickly lock onto the floating wavelength grid of the received WDM signal knowing the set maximum operating temperature, $T_1$, communicated from the transmitter to the receiver as an OSC signal or as part of the WDM signal header of the transmitted WDM signal.

It is also within the scope of this invention to have more than one TxPIC at the transmitter so that at least two floating signal wavelength grids with fixed channel spacings are present where one wavelength grid is longer than the other wavelength and the two grids do not overlap in wavelength spectrum. In this case, the two TxPICs are operated and maintained at different temperature levels within the high temperature range, such as between room temperature and about 70° C. or more, so that the grid bandwidths stay within prescribed and separated grid bands via transmitter control so that neither grid will walk into the other grid due, for example, to ambient temperature changes within a predetermined temperature range. At least two demultiplexers at the receiver, usually preceded by a band deinterleaver, then can lock independently on the separate grids and demultiplex the incoming multiplexed channel signals. In this embodiment, the transmitter can transmit either in the signal frame overhead or via an OSC signal channel the prescribed boundary conditions of the different signal bands and their thermal operating range. In this embodiment, it is preferred that the optical receiver has the capability of receiving many more different wavelength channels than are actually transmitted so that the receiver is intelligently competent to detect multiple or several different but spatially separated floating signal channel grids transmitted by one or more different optical transmitters in the optical transmission network.

Also, it will clear to those who are skilled in the art that if the bandwidth of the laser source bandwidth is narrow due to a narrow channel spacing such as, for example, 50 GHz spacing between channels, then multiple, cascaded demultiplexer stages may be necessary at the optical receiver to enable good lock-on to the floating signal grid transmitted from the optical transmitter. A specific example is two cascaded AWG demultiplexer system at the optical receiver respectively performing a filter function, i.e., two different filter functions are performed. The first filter function is a keying, i.e., the AWG wavelength grid is brought into alignment with the floating wavelength grid of the incoming multiplexed channel signals. In such a case, the transmitter may have sent a key as to its current operating temperature or a reference wavelength upon which the AWG wavelength grid should be keyed to. The second filter is deployed to insure low crosstalk exists in the signal path. There may be more than one AWG performing this second function with each AWG receiving an output from the first AWG. In another embodiment, the cascaded filters could comprise a first broadband demultiplexer to discover and tune to the floating but fixed channel spacing grid of the incoming multiplexed channel signals and a second narrow band demultiplexer to demultiplex the channel signals as a plurality of channel signals for conversion from the optical domain into the electrical domain. A further embodiment is for the first filter function to be comprised of two gratings with taps, one grating at the long-wavelength end of the expected spectrum of the incoming signal wavelength grid and the other grating at the short-wavelength end of the expected spectrum of the incoming signal wavelength grid. When a simultaneous discovery of both the lowest and highest potential frequencies of the grid has been achieved, the entire comb of the incoming signal grid has been detected and is locked. The grid of the second AWG demultiplexer can be matched to the incoming signal grid based upon the grid lock-on achieved by the first AWG multiplexer for purposes of demultiplexing the multiplexed channel signals.

It should be understood with respect to the foregoing described as well as the embodiments of FIGS. 10-12 that to lock onto an incoming signal channel grid would preferably include, particularly at startup, an OSC signal back to the transmitter that a signal channel grid has been sensed or auto-discovered and a lock-on condition has been achieved for proper handshaking methodology.

It should also be recognized relative to any of the foregoing described embodiments that the transmitter can, at startup, transit an initial OSC signal or in a dummy signal frame overhead as to what is the designated startup temperature to be expected by the receiver. For example, instead of the receiver starting at the bottom of the acceptable operating temperature range, such as, for example, beginning at 40° C., the designated startup temperature can be transmitted by the transmitter to be higher in the temperature range, such as at 50° C. The receiver can then initially lock the demultiplexer to this temperature or a temperature corresponding to a lookup table suitable for the bandwidth of the demultiplexer which may be different from the bandwidth of the incoming channel grid. After this initial startup procedure, the receiver multiplexer can continue to detect changes or shifts in the incoming channel grid due to changes in ambient temperature at the transmitter, which changes can be continuously transmitted from the optical transmitter or detected via auto-discovery at the optical receiver. In either case, if the receiver loses its locked state on the incoming signal channel grid, it can inform the transmitter via an OSC signal that an unlocked state has occurred and the startup process needs to be reinitiated followed by retransmission of the missed channel signals.

It will be realized by those skilled in the art that in the forgoing network transmission embodiments of this invention that exemplify thermally actuated AWGs at the transmitter and receiver could alternatively be electro-optically tuned type rather than of the thermally tuned type. An example of an electro-optically tuned type is disclosed in U.S. published application No. 2002/0172463, published on Nov. 21, 2002 and incorporated herein by its reference. In this example, the lengths of the grating arms of an AWG may be independently varied by application of an electric field across each of the several arms to tune the AWG to match the wavelength grid of a modulated source array or multiplexed channel signal.

It should be further realized that in connection with the preceding embodiments, in some cases, an off-chip laser source wavelength stabilization and feedback system of peak wavelengths of the individual signal channels present on the TxPIC need not be employed but rather a frequency detection system is provided that detects laser source wavelengths and/or power, and readjusts and thereafter maintains the wavelength channel spectral spacing between adjacent laser sources on the TxPIC and/or provide pre-emphasis across the signal outputs of the modulated sources as previously indicated. A preferred way of detecting laser source wavelength operation to achieve this goal is to utilize a narrow band electrical filter in the feedback system which can, for example, detect an interference pattern from a pair of fast-response photodetectors monitoring one or two laser source outputs. In this case, it would be preferred that these photodetectors be integrated on the TxPIC. This scheme would replace the present larger external etalon generally employed for laser source wavelength detection. Examples of such dual wavelength, integrated detectors that may be deployed on a TxPIC chip are disclosed in FIGS. 13-19 and 25-27, which are explained below. Other embodiments with multiple on-chip wavelength photodetectors at the output of the on-chip combiner, e.g., an AWG, are disclosed in FIGS. 20-21, 23 and 24. The most sensitive wavelength monitoring device integrated on the chip would be an AWG multiplexer and can be used, like the other detector schemes in FIGS. 13-27 for wavelength control instead of deployment of a conventional external etalon as well known in the art. FIG. 22 operates with one or more optical ring resonators in combination with a single photodetector for each modulated source. However, it should be realized that it is within the scope of this invention to utilize offset etalons that are temperature independent for tracking and discerning laser source operating wavelengths. Also, it is within the scope of this invention to have etalons that are temperature matched to associated laser sources to track the laser source emission wavelengths. In this regard, a preferred embodiment is to integrate such etalons on the TxPIC chip, e.g., InP-based, integrated etalons.

Before explaining the various embodiments of integrated wavelength detectors of FIGS. 13-27, it should be importantly noted that these integrated detectors need not be only deployed in PICs that are coolerless operated via heaters but also may be employed in conjunction with PICs that are temperature controlled with coolers, such as with TECs. In other words, is should be clearly understood that the disclosed integrated detectors herein can be employed in any temperature controlled (cooler or heated) or uncontrolled (floating) environment.

Each of the detector representations of FIGS. 13-19 are integrated dual photodetectors on the TxPIC monitoring the rear output from the laser source. In FIG. 13, there is shown one PIC signal channel 170 out of N channels with a front PIN photodiode 171, EAM 172 and laser diode source (LD) 173. At the rear facet of laser source 173 is a Y-branch waveguide 174 with one end 174A integrated to the back facet of the laser source 173 and at the ends of the Y-branched waveguide arms 174B and 174C is a photodetector 175A and 175B, such as PIN or APD photodiode. First order gratings 176A and 176B are also in each of the arms 174B and 174C of Y-branch waveguide 174. The center wavelengths of the respective gratings 176 are offset from opposite sides the target emission wavelength of laser source LD 173 such that the zero crossing the Gaussian outputs of photodetectors 175A and 175B is at the target wavelength. These two gratings can be made to be sufficiently weak in filtering strength to minimize any detrimental reflective feedback to laser source 173. Optionally, a phase shift may be deployed in one of the Y-branch arms 174B and 174C.

The integrated channel 170A in the FIG. 14 embodiment is the same as the FIG. 13 embodiment except that the two are gratings 176A and 176B are set with center wavelengths at the target emission wavelength of laser source 173 and ½ phase shift region 177 is formed in one of the Y-branch arms 174C. As long as the target emission wavelength is not at resonance, the photocurrent detected by arm photodetectors 175A and 175 B will be different. At resonance, i.e., at the target emission wavelength, there will be strong light scattering but the response of the two photodetectors 175A and 175B will be at a minimum or close to zero due to the grating light scattering at the target wavelength. With a single target emission wavelength involved in this detection scheme, a phase shift at 177 is required. The backward scattered light toward laser source 173 will destructively interfere at Y-branch junction 174A thereby suppressing or otherwise eliminating possible interfering frequency feedback into laser source 173.

In the FIG. 15 embodiment, channel 170B does not include gratings 176 in the previous two embodiments or a phase shifter 177. Rather, an absorber 178 is positioned in one of the arms 174B which provides a complex refractive index change that provides an photodetector power and phase difference relative to the light detected by the respective photodetectors 175A and 175B.

FIG. 16 is a side elevation of an integrated photodetector pair relative to one signal channel 180 on a PIC where the channel waveguide portion shown is coupled to the rear fact of a laser source (not shown) via single waveguide 181. The concept here includes a high order grating 182 having a center wavelength at the target emission wavelength for the laser source and is deployed in waveguide 181 to eliminate the backward reflection in the waveguide as well as upwardly scatter the rearward propagating light principally to the first of two, out-of-waveguide photodetectors, PD1 at 183. Photodetector PD2 at 184 will receive comparatively less light for detection. Since detector 184 is further away from the laser source than the other photodetector 183, the ratio of the absorbed photocurrents of these different photodetectors will be different. At the moment that the target emission wavelength is achieved in the laser source, such as due to its temperature or current bias change, the ratio of the detected light between photodetectors 183 and 184 will go to a minimum because the scattered light will render the amount of light absorbed by either photodetector more equal. As another embodiment relative to FIG. 16, the grating in FIG. 16 can be replace with blazed or angled grating at the target emission wavelength to achieve off-axis reflection and also eliminate backward grating in-waveguide reflection to end 185 of waveguide 181.

The embodiment of FIG. 17, which is a plan view, operates in substantially the same way as the embodiment of FIG. 16 except that in channel 180A one photodetector, PD1, at 186 is outside the cavity of waveguide 187, which is coupled to the laser source (not shown), whereas the other photodetector, PD2, at 188 is in and positioned at the end of waveguide 187. Thus, the ratio of photocurrent from photodetectors 186 and 188 can be accomplished with one waveguide 187 coupled to the laser source. The grating 182 is set at the target emission wavelength for the laser source so that the amount of light received by PD1 at 186 will be minimal at non-resonant condition. When resonance is achieved, such as due to operating temperature or current bias changes made to the laser source, a large amount of light will be scattered by grating 182 to both photodetectors 186 and 188 so that the ratio of the detected light between these photodetectors will go to a minimum because the scattered light will render the amount of light absorbed by either photodetector to be more equal. Note that grating 182 can be adjusted to scatter more light to PD2 at 188 rather than to PD1 at 186. Another alternative to this embodiment is to fabricate photodetectors 186 and 188 to have different lengths, and therefore different absorption lengths, and re-position both photodetectors 186 and 188 to receive more equal amounts of light from the laser source. The ratio of absorption of the photodetectors will be different so that that when resonance is achieved, the ratio of the detected light between photodetectors 186 and 188 will go to a minimum because the scattered light with render the amount of light absorbed by either photodetector to be more equal.

The integrated photodetector arrangement in FIG. 18 for signal channel 190 comprises a Mach-Zehnder interferometer (MZI) 192 where arms 193 and 194 between couplers 195A and 195B of the device are different lengths (arm 193>arm 194) and functions as a asymmetric MZ homodyne. The phase shift or other outputs from coupler 195A of MZI 192 are detected by integrated photodetectors 196 and 197. This detector is highly sensitive to wavelength changes at the laser source (not shown) and has narrow range of operation. In one embodiment, this detector scheme may be deployed for fine tuning the emission wavelength of the laser source while a coarse adjustment can be handled by another detector arrangement such as the vernier based detector arrangement of FIG. 20.

The channel 190A in the embodiment of FIG. 19 is a variant of the embodiment of FIG. 18 except that there is only one coupling region 198. This co-directional coupling region 198 is long in length and designed such that there is cross coupling only at certain wavelengths when the laser source is operating at the target emission wavelength so that the pair of photodetectors 196 and 197 will be at their zero crossing point. The detected outputs can be provided to a differential amplifier where the output will null or zero when the detected signals are at a zero crossover, indicating that they are identical and a lock condition has been achieved. In another embodiment of FIG. 19, the application of a dither signal to the laser source can be used so that when a null (peak) is reached, it is difficult to determined if the across over of the signals may have drifted. By laser source dithering, this undetected condition position can be eliminated.

The embodiment shown in FIG. 20 comprises the use of a PIC combiner 200, indicated here as wavelength selective combiner such as an AWG. It should be noted that the combiner in this embodiment as well as subsequent embodiments can also alternatively be a non-wavelength selective combiner or decombiner, such as the multimode interference coupler shown in FIG. 27 or a wavelength selective decombiner. Rather than the individual laser sources to determine or detect their emission wavelengths from a plurality if modulated sources if a TxPIC. As shown in FIG. 20, the center output of the AWG is the zero Brillouin order multiplexed WDM signal output 201 from AWG 201. The other zero Brillouin order outputs 202 on adjacent sides of center output 201 have photodetectors 204 integrated at their ends. The ratio of power in the different photodetectors 204, relative to one another, is a measure of wavelength shift of the multiple emission wavelengths that appear in the each of the respective channel outputs detected by photodetectors 204. While the vernier detector of FIG. 20 can provide for wavelength auto-discovery for fine emission wavelength tuning, vernier outputs 202 can also be placed at some multiple temperature shift, e.g., 140 GHz=10° C. change, to provide for a coarse emission wavelength tuning arrangement.

In the combiner 205 of the embodiment of FIG. 21, the higher Brillouin zones (BZs) 106A and 106B, as known in the art, are exact wavelength replica of the zero Brillouin order. A photodetector (PD) 201 is provided for each of the channels represented by the number of BZ outputs 206A and 206B with a passband offset to either side of the target wavelength of the respective signal channels. The detected signals from the +1 BZ outputs at 206A and the −1 BZ outputs at 206B can function as zero crossing differential detectors.

In the embodiment of FIG. 22, there is shown single channel 210 of a TxPIC or of a single EML where there is integrated on the same chip a ring oscillator 211 resonating at a given wavelength dependent on the size of the ring. Ring oscillator 211 can be designed to be set to the target emission wavelength of laser source (LD) 212. Ring oscillator 211 is coupled on one side to waveguide 213 between laser source 212 and modulator (EAM) 214 and on the other side to waveguide 215 that contains photodetector (PD) 216 which may be placed at either end of waveguide 215. The detected signal at PD 216 will be at a maximum when the emission wavelength of laser source 212 is the same as the ring frequency of ring oscillator 211. There can be, in series, a plurality of coupled oscillator rings 211 but one such ring 211 per channel should be sufficient.

In the embodiment of FIG. 23, there is combination of the integrated detector concepts shown in both FIGS. 19 and 20. At the two higher + and − Brillouin zones (BZs) at 222A and 222B of combiner 220, plural ring oscillators 224 together with optically coupled photodetectors 226 are coupled along Brillouin zone (BZ) waveguides 222A and 222B. The ring oscillators 224 are set to have ring frequencies of respective target emission wavelengths of the respective on-chip laser sources. Thus, there are N combination ring oscillator/photodetectors for N signal channels of a TxPIC. Here, in this embodiment, N=8. The Brillouin zone (BZ) outputs on waveguides 22A and 22B have multiple combined wavelengths of the WDM signal. When any one of the wavelengths in this output is in resonance with a given ring oscillator 224 that is indicative that the detected laser frequency is the same as the oscillator ring frequency. A portion of that ring frequency light will leak from ring oscillator 224 to its corresponding PD 226 which is then indicative that a laser source emission wavelength has been achieved. In another embodiment of FIG. 23t, a wavelength offset technique can be deployed for wavelength detection or a zero crossing differential detector scheme can be used in this embodiment.

The FIG. 24 embodiment relative to combiner 230 is a further variant of the embodiment for the combiner 220 shown in FIG. 23 where a set of on-chip or integrated Echelle gratings 232 is deployed for dispersing the BZ output at predetermined angles from the gratings 232 depending upon the wavelength. The dispersed wavelengths of coupling respective laser sources are coupled into a respective on-chip waveguide 234 having a photodetector 236 at its end to detect the amplitude of received light. In another embodiment, the dispersive properties of the Echelle gratings can be tuned such that differential detection can be employed using two different outputs from the respective BZ detected outputs.

The embodiment in FIG. 25 of a single waveguide channel 240 is similar to the embodiment shown in FIG. 16 where detectors 244 and 246 in series along waveguide 242 coupled to the laser source (not shown) but without the use of any gratings. The ratio of the signal detected by photodetectors 244 and 246 will vary with the wavelength as absorption of these detectors varies with wavelength. Since the absorption lengths of photodetectors 244 and 246 change with temperature, photodetectors 244 and 246 will also detect wavelength changes with changes in laser source temperature so that the effect will be magnified between the two photodetectors because of a difference in the magnitude of the signal difference of the photocurrent of photodetectors 244 and 246 which is dependent on ambient temperature. Such a magnifying condition is not possible in the embodiment of FIG. 16 because there is no magnified magnitude due to the presence of the grating In another embodiment, the embodiment alternative may be the same as the embodiment shown in FIG. 15, but without the in-waveguide gratings and including absorber 178 in one of the arms 174B and 174C so that the absorber-containing arm 174B will absorb light a little differently since, with the presence of absorber 178, the phase effect will be magnified between the two photodetectors because of a difference in the magnitude of the signal difference of the photocurrent of photodetectors 244 and 246 which is dependent on ambient temperature. As a result, this detection scheme may be preferred over some of these previous embodiments because of an improved OSNR.

It should be realized that relative to the integrated photodetector embodiments of FIG. 25 that additional in-series photodetectors can be included in the embodiments to enhance detection sensitivity. Also, in the immediately above another embodiment, similar to FIG. 15, this embodiment can be extended to include a power splitter at the end of each waveguide 242 and have multiple arms extending from each split waveguide end and each such waveguide terminated with a photodetector. In this case, with this increase in the number of photodetectors per channel, the detection sensitivity will be enhanced.

Reference is now made to FIG. 26 which shows a further embodiment for on-chip, integrated wavelength detection. In this embodiment, as in previous embodiments, only one signal channel 250 is shown comprising laser source 251, modulator 252 and PIN photodetector or power changing element (PCE) 253. The integrated device comprises two-mode interference (TMI) waveguide 254 which is an asymmetrically excited multimode waveguide that is asymmetrically coupled at 254A of waveguide 250A of laser source 251, which coupling offset is shown in exaggerated form in FIG. 26. Waveguide 254 has a single mode Y-branch splitter 255 and the ends of the waveguides 254B and 254C from Y-branch splitter 255 each have a photodetector, PD1 at 256 and PD2 at 257. This device is also disclosed in FIGS. 1 at 20, 22, 24a, 24b and 40 in U.S. Pat. No. 6,714,566, which patent is incorporated herein by its reference. The principal of operation is similar to a multimode interference (MMI) coupler in that the laser source rear fact output to the on-chip integrated Y-branch waveguide 254 is offset relative to its multimode waveguide input at 254A relative to waveguide 250A, which offset excites the two lowest order modes of multimode waveguide 254 which then beat to produce an interference pattern which is wavelength dependent. When the second order mode engages Y-branch 255, the modes behave differently in waveguide branches 254B and 254C to respective photodetectors 256 and 257, where the behavioral difference is an indication of changes of laser emission wavelength with temperature.

Reference is now made to the embodiment shown in FIG. 27 which is a wavelength detector in the form of a multimode interference (MMI) coupler 260. Most designs of such couplers are traditionally designed to operate at resonance so that they are highly insensitive to wavelength. However, for wavelength detection, the coupler must be designed with enhanced wavelength sensitivity. As seen in FIG. 27, input 262 to MMI coupler 260 has offset rear outputs 263 and 264, such as from two adjacent signal channels, and where input 262 to coupler 260 is also off center. The output power from both channels can be on center or off center, as shown, and the two outputs 263 and 264 of these channels can be coupled to a respective the photodetectors (not shown) at outputs 263 and 264 where the crosspoint at 265 between the two Gaussian outputs of the photodetectors is an indication of their spatial frequency separation or spectral spacing between adjacent signal channels. In this manner, the desired spatial frequency can be monitored between two adjacent channels and the wavelength of one or both channels can be changed to maintain the desired channel spatial frequency separation.

As previously indicated, the on-PIC AWG is the most sensitive device for an on-chip wavelength detection scheme to replace the conventional external etalon which is currently in wide use for transmitter multiple wavelength detection. In an InP-based AWG, although the center wavelength tunes at a rate of approximately 16.25 GHz/° C., the spectral channel spacing remains relatively constant. For example, in the temperature range between about 20° C. and about 80° C., the PIC AWG and the corresponding DFB laser sources tune across about 1,000 GHz, but the variation in separation between the channels remains relative small. For the DFB laser sources, the range is between about ±20 GHz and about ±30 GHz. However, the on-chip AWG is even more stable with a variation of only about ±5 GHz, which is approximately only about 0.5% of the total tuning range. This temperature stability is reason why the on-chip wavelength sensing embodiments of FIGS. 20 to 24 are believed to possibly be the preferred embodiments.

One of the pending issues for broadening the temperature range of operation of TxPICs with a floating wavelength grids is the limitation of operating the on-chip EAMs below room temperature, for example, due to the large detuning of the EAMs at lower temperatures when these devices are designed to accommodate for the red shift of the bandedge of a bandedge EAM with respect to the emission wavelength of its corresponding channel DFB at higher operating temperatures. This large detuning results in a poorer extinction ratio and chip behavior of the EAMs. There are two approaches to mitigate this EAM behavior and the extend the operating range of the TxPIC, which is most comfortable between about 20° C. and about 70° C., to lower temperature operation. The first approach is to include on the TxPIC in each signal channel a SOA following the EAM and reduce the amount of laser-modulator detuning. The lower detuning would insure proper operation of the EAM at lower temperatures and the on-chip SOA would compensate for higher on-state loss of the EAM, which results because of lower detuning of the EAMs with respect to the DFB laser sources. Also, the SOAs would also be employed to maintain the required output levels at higher temperatures where the bias on the laser sources may be with increasing ambient temperatures. Also, as previously indicated, an on-chip VOA for each channel, following a corresponding SOA, can be deployed with a negative bias for purposes of on-chip pre-emphasis across the modulated source array.

The second approach, which has already been previously mentioned and discussed, is to provide a heater associated with each EAM, separate from the DFB laser source heater, and employ the EAM heaters to maintain a large laser-modulator detuning. The EAM heaters would be operated based upon feedback from a coarse thermal sensor or detector, e.g., a thermistor, for monitoring the ambient temperature of the TxPIC chip. As the temperature of the TxPIC chip falls, for example, the local EAM heaters compensate for the temperature drop by increasing the temperature of their corresponding EAM and to maintain their optimized temperature and thereby maintain the modulator extinction ratio (ER) and its chirp performance. Unlike the DFB and similar light emitting devices, the dynamic performance of the EAM is less sensitive to changes in temperature, with the exception of laser-modulator detuning which changes to a greater degree with temperature.

While the invention has been described in conjunction with several specific embodiments, it is evident to those skilled in the art that many further alternatives, modifications and variations will be apparent in light of the foregoing description. An important example of this is that the floating wavelength grid technique of this invention may also be deployed in conventional WDM transmission systems having discrete transmitters as long as the transmitters are capable of having thermally floating wavelengths within the same temperature ambient. However, it is realized that with such discrete transmitter devices, it is more likely to be difficult to control channel spacing among multiple signal channels. Thus, the approach to conventional WDM systems becomes more acceptable where the signal channel thermal ambient environment is relatively small enough so that isothermic changes occur in a substantially identical manner to all signal channels at the same time. Such a small environment is of a natural consequence, of course, in a TxPIC chip which may have, for example, 10 to 80 channels on a single semiconductor chip. Thus, the invention described herein is intended to embrace all such alternatives, modifications, applications and variations as may fall within the spirit and scope of the appended claims.

What is claimed is:

1. A photonic integrated circuit (PIC) comprising:
a plurality of optical sources,
   each of the plurality of optical sources providing a corresponding one of a plurality of first optical signals based on a first temperature,
      each of the plurality of first optical signals having a respective one of a plurality of first wavelengths,
         the plurality of first wavelengths forming a signal channel wavelength grid,
      each of the plurality of first optical signals being combined to form a wavelength division multiplexed signal for transmission on an optical link; and
a circuit coupled to the plurality of optical sources,
   wherein, based on a second temperature, each of the plurality of optical sources outputs a corresponding one of a plurality of second optical signals,
the circuit configured to:
   control at least one of the plurality of optical sources such that each of the plurality of second optical signals has a corresponding one of a plurality of second wavelengths,
      each of the plurality of second wavelengths being uniformly shifted relative to a corresponding one of the plurality of first wavelengths,
wherein:
   each of the plurality of optical sources comprises a corresponding one of a plurality of lasers,
   each of the plurality of lasers provides a respective one of a plurality of light signals at a respective one of the plurality of first wavelengths,
   each of the plurality of lasers has an active region with an active region wavelength, and the respective one of the plurality of first wavelengths is positively detuned from a peak of the active region wavelength,
positively detuning the respective one of the plurality of first wavelengths causing a gain of the laser to increase as a temperature of the laser increases.

2. The photonic integrated circuit of claim 1 wherein the first and second temperature are within a predetermined temperature range.

3. The photonic integrated circuit of claim 2 wherein the predetermined temperature range is approximately between a surrounding room temperature and a high temperature below 100° C.

4. The photonic integrated circuit of claim 2 wherein the temperature range is between about 20° C. and 85° C.

5. The photonic integrated circuit (PIC) of claim 1 wherein each of the plurality of optical sources is a corresponding one of a plurality of modulated optical sources, and each of the plurality of first optical signals is a plurality of first modulated optical signals.

6. The photonic integrated circuit of claim 5 wherein each of the plurality of modulated optical sources is coupled to a respective one of a plurality of power charging elements.

7. The photonic integrated circuit of claim 5 wherein each of the plurality of modulated sources comprises a corresponding one of a plurality of lasers coupled to a corresponding one of a plurality of modulators.

8. The photonic integrated circuit of claim 7 wherein each of the plurality of modulators is an electro-absorption modulator.

9. The photonic integrated circuit of claim 1 wherein there is no cooler to maintain the PIC at a given temperature.

10. The photonic integrated circuit of claim 1 wherein the first temperature and the second temperature are higher than a surrounding room temperature.

11. The photonic integrated circuit of claim 1 further comprising a heater, wherein the photonic integrated circuit is heated to, and maintained at, a set operating temperature.

12. The photonic integrated circuit of claim 11 wherein the set operating temperature is above a surrounding room temperature.

13. The photonic integrated circuit of claim 12 wherein the set operating temperature is below about 85° C.

14. A transmitter photonic integrated circuit comprising:
a plurality of modulated sources,
each of the plurality of modulated sources configured to output a corresponding one of a plurality of optical signals,
each of the plurality of modulated optical signals having a corresponding one of a plurality of wavelengths,
the plurality of wavelengths constituting a laser source wavelength grid;
an optical combiner having a plurality of inputs and an output,
each of the plurality of inputs of the optical combiner configured to receive a corresponding one of the modulated optical signals and combine the corresponding one of the modulated optical signals into a wavelength division multiplexed signal provided at the output of the optical combiner,
the optical combiner having a passband wavelength grid;
a heater configured to maintain the operation of the photonic integrated circuit at an operating temperature above a room temperature; and
a circuit coupled to the plurality of modulated sources,
the circuit configured to control the wavelengths of each of the plurality of modulated optical signals and maintain the laser source wavelength grid in substantial alignment with the passband wavelength grid of the optical combiner and for optimizing the operation of the modulators with changes resulting from said grid alignment,
wherein:
each of the plurality of modulated optical sources comprises a corresponding one of a plurality of lasers,
each of the plurality of lasers provides a respective one of a plurality of light signals at a respective one of the plurality of wavelengths,
each of the plurality of lasers has an active region with an active region wavelength, and
the respective one of the plurality of wavelengths is positively detuned from a peak of the active region wavelength,
positively detuning the respective one of the plurality of first wavelengths causing a gain of the laser to increase as a temperature of the laser increases.

15. The transmitter photonic integrated circuit of claim 14 where the circuit comprises a programmable logic controller.

16. A transmitter photonic integrated circuit comprising:
a plurality of modulated sources,
each of the plurality of modulated sources being configured to output a corresponding one of a plurality of optical signals at a respective one of a plurality of wavelengths;
a plurality of photodetectors,
each of the photodetectors configured to receive a portion of a respective one of the plurality of optical signals and provide a corresponding one of a plurality of electrical signals,
a heater to heat a corresponding one of the plurality of modulated sources to an operating temperature above a surrounding room temperature; and
a controller,
the controller configured to:
receive the plurality of electrical signals and change a corresponding one of the plurality of wavelengths of one or more of the plurality of modulated sources so that a spectral spacing between adjacent ones of the plurality of wavelengths is maintained at a predetermined one of a plurality of spectral spacings,
wherein,
each of the plurality of modulated sources comprises a corresponding one of a plurality of lasers,
each of the plurality of lasers provides a respective one of a plurality of light signals at a respective one of the plurality of wavelengths,
each of the plurality of lasers has an active region with an active region wavelength, and
the respective one of the plurality of wavelengths is positively detuned from a peak of the active region wavelength,
positively detuning the respective one of the plurality of first wavelengths causing a gain of the laser to increase as a temperature of the laser increases.

17. The transmitter photonic integrated circuit of claim 16 wherein the heater is a strip heater formed on one or more of the plurality of modulated sources.

18. The transmitter photonic integrated circuit of claim 16 wherein each of the plurality of electrical signals represents a respective one of the plurality of wavelengths, the controller configured to sense changing emission wavelength conditions due to changing ambient temperature conditions of the photonic integrated circuit.

19. The transmitter photonic integrated circuit of claim 16 wherein the heater is a first heater, the photonic integrated circuit further including a second heater for heating the optical combiner.

* * * * *